US011881538B2

(12) United States Patent
Kang et al.

(10) Patent No.: US 11,881,538 B2
(45) Date of Patent: Jan. 23, 2024

(54) APPARATUS AND METHOD FOR MANUFACTURING DISPLAY DEVICE

(71) Applicant: Samsung Display Co., LTD., Yongin-si (KR)

(72) Inventors: Cheol Ku Kang, Uiwang-si (KR); Buem Joon Kim, Hwaseong-si (KR); Won Kyu Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 253 days.

(21) Appl. No.: 17/519,248

(22) Filed: Nov. 4, 2021

(65) Prior Publication Data

US 2022/0165911 A1 May 26, 2022

(30) Foreign Application Priority Data

Nov. 24, 2020 (KR) ........................ 10-2020-0158365

(51) Int. Cl.
*H01L 33/00* (2010.01)
*H01L 21/68* (2006.01)

(52) U.S. Cl.
CPC .......... *H01L 33/005* (2013.01); *H01L 21/681* (2013.01); *H01L 2933/0066* (2013.01)

(58) Field of Classification Search
CPC ........... G09G 3/006; G09G 2300/0443; G09G 2320/0285; G09G 3/3241; G09G 3/32;
(Continued)

(56) References Cited

U.S. PATENT DOCUMENTS 11,011,597 B2 * 5/2021 Kim ...................... G09G 3/3275
2017/0038427 A1 * 2/2017 Kim ....................... G09G 3/006
(Continued)

FOREIGN PATENT DOCUMENTS

| KR | 10-2008-0077723 A | 8/2008 |
|----|----|----|
| KR | 10-1490758 B1 | 2/2015 |
| KR | 10-2020-0085977 A | 7/2020 |

OTHER PUBLICATIONS

Martin, G.N.N., *Range encoding: an algorithm for removing redundancy from a digitised message.; IBM UK Scientific Center, Southampton Jul. 24-27, 1979, Original manuscript sourced from Dr. Glen Langdon Nov. 1996; 11 pages.

*Primary Examiner* — Monica C King
(74) *Attorney, Agent, or Firm* — Lewis Roca Rothgerber Christie LLP

(57) ABSTRACT

An apparatus for manufacturing a display device, comprising a stage, a first electric-field-applying module on a first side of the stage, and including first probe pins, a first light-irradiating module above the stage, and configured to irradiate light to the stage, a first light emission driver configured to transmit a first emission driving signal to the first light-irradiating module, and a signal output unit configured to output a first emission timing signal for setting light irradiation timing of the first light-irradiating module to the first light emission driver, to output a first alignment signal to any one of the first probe pins, and to output a second alignment signal to another one of the first probe pins, wherein the first emission timing signal and the second alignment signal are alternating current (AC) signals, and wherein periods of the first emission timing signal and the second alignment signal are the same.

20 Claims, 28 Drawing Sheets

(58) Field of Classification Search
CPC . H01L 27/156; H01L 25/0753; H01L 25/167; H01L 21/68; H01L 33/62; H01L 21/02288; H01L 21/67098; H01L 21/67144; H01L 21/6715; H01L 21/67715; H01L 22/14; H01L 2224/24051; H01L 2224/24101; H01L 2224/24145; H01L 2224/25175; H01L 2224/95102; H01L 2224/95133; H01L 24/24; H01L 24/25; H01L 24/95; H01L 33/0095; H01L 21/681; H01L 22/12; H01L 22/32; H01L 2224/95085; H01L 2224/95101; H01L 2933/0066; H01L 33/005; H01L 22/20; H05B 33/10; G02F 1/1303

See application file for complete search history.

(56) References Cited

U.S. PATENT DOCUMENTS

| | | | |
|---|---|---|---|
| 2018/0219025 A1* | 8/2018 | Takahashi | G09G 3/32 |
| 2020/0135815 A1* | 4/2020 | Kim | G09G 3/006 |
| 2020/0185421 A1* | 6/2020 | Takahashi | G09G 3/32 |
| 2021/0210512 A1* | 7/2021 | Takahashi | G09G 3/3611 |
| 2021/0320089 A1* | 10/2021 | Kang | H05K 13/04 |

* cited by examiner

APPARATUS AND METHOD FOR MANUFACTURING DISPLAY DEVICE

CROSS-REFERENCE TO RELATED APPLICATION

This application claims priority to, and the benefit of, Korean Patent Application No. 10-2020-0158365, filed on Nov. 24, 2020, in the Korean Intellectual Property Office (KIPO), the entire content of which is incorporated by reference herein.

BACKGROUND

1. Field

The present disclosure relates to an apparatus and method for manufacturing a display device.

2. Description of the Related Art

Display devices are becoming increasingly important with the development of multimedia. Accordingly, various types of display devices, such as organic light emitting displays and liquid crystal displays, are being used.

A display device includes a display panel, such as a light emitting display panel or a liquid crystal display panel, as a device for displaying an image of the display device. Among them, the light emitting display panel may display an image by emitting light using light emitting elements. Here, when light emitting diodes (LEDs) are used as the light emitting elements, organic light emitting diodes (OLEDs) using an organic material as a fluorescent material or inorganic LEDs using an inorganic material as the fluorescent material may be used as the light emitting elements.

SUMMARY

Aspects of some embodiments of the present disclosure provide an apparatus for manufacturing a display device, and a method of manufacturing a display device, which can increase alignment accuracy of light emitting elements.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, there is provided an apparatus for manufacturing a display device including a stage, a first electric-field-applying module on a first side of the stage, and including first probe pins, a first light-irradiating module above the stage, and configured to irradiate light to the stage, a first light emission driver configured to transmit a first emission driving signal to the first light-irradiating module, and a signal output unit configured to output a first emission timing signal for setting light irradiation timing of the first light-irradiating module to the first light emission driver, to output a first alignment signal to any one of the first probe pins, and to output a second alignment signal to another one of the first probe pins, wherein the first emission timing signal and the second alignment signal are alternating current (AC) signals, and wherein a period of the first emission timing signal is the same as a period of the second alignment signal.

The first alignment signal may be a direct current (DC) signal.

The first emission timing signal may have a second high level voltage at a time when the second alignment signal changes from a first low level voltage to a first high level voltage.

A period during which the second alignment signal rises from the first low level voltage to the first high level voltage may be shorter than a period during which the second alignment signal falls from the first high level voltage to the first low level voltage.

The period during which the second alignment signal rises from the first low level voltage to the first high level voltage may be longer than the period during which the second alignment signal falls from the first high level voltage to the first low level voltage.

The second alignment signal may have the first high level voltage during a first period and the first low level voltage during a second period.

At least a portion of a period during which the second alignment signal has the first high level voltage and at least a portion of a period during which the first emission timing signal has the second high level voltage may overlap each other.

The period during which the second alignment signal has the first high level voltage may be longer than the period during which the first emission timing signal has the second high level voltage.

The first emission timing signal may have the second high level voltage during a first period and a second low level voltage during a second period.

The apparatus may further include a second light-irradiating module on the stage, configured to irradiate light to the stage, and neighbors the first light-irradiating module.

The apparatus may further include a second light emission driver configured to transmit a second emission driving signal to the second light-irradiating module according to a second emission timing signal for setting light irradiation timing of the second light-irradiating module.

The first light emission driver may include a constant current control circuit configured to provide a constant current to light emitting diodes of the first light-irradiating module, and a transistor between the light emitting diodes and a ground voltage source, and configured to be turned on according to the first emission timing signal.

The apparatus may further include a second electric-field-applying module on a second side of the stage, and including second probe pins, a first amplifier configured to amplify the first alignment signal and the second alignment signal, and to output the amplified first alignment signal and the amplified second alignment signal to the first probe pins of the first electric-field-applying module, and a second amplifier configured to amplify the first alignment signal and the second alignment signal, and to output the amplified first alignment signal and the amplified second alignment signal to the second probe pins of the second electric-field-applying module.

According to another aspect of the present disclosure, there is provided a method of manufacturing a display device, including forming a first alignment line and a second alignment line on a mother substrate, forming an outer bank on the first alignment line and the second alignment line, applying a solution including light emitting elements to a first opening defined by the outer bank, aligning the light emitting elements by forming an electric field by applying a first alignment voltage to the first alignment line and applying a second alignment voltage to the second alignment line, and removing the solution by volatilizing the solution, wherein the aligning of the light emitting elements by forming the electric field includes generating a first alignment signal, and a second alignment signal and a first emission timing signal, transmitting the first alignment signal and the second alignment signal to a first alignment pad electrically connected to the first alignment line and a second alignment pad electrically connected to the second alignment line through first probe pins of a first electric-field-applying module, and irradiating light to the mother substrate by transmitting a first emission driving signal to light emitting diode arrays of a first light-irradiating module according to the first emission timing signal, and wherein a period of the first emission timing signal is same as a period of the second alignment signal.

The first alignment signal may be a DC signal.

The first emission timing signal may have a second high level voltage at a time when the second alignment signal changes from a first low level voltage to a first high level voltage.

The first emission timing signal may have the second high level voltage during a first period, and a second low level voltage during a second period.

The transmitting of the first alignment signal and the second alignment signal to the first alignment pad electrically connected to the first alignment line and the second alignment pad electrically connected to the second alignment line through the first probe pins of the first electric-field-applying module may include amplifying the first alignment signal and the second alignment signal, and transmitting the amplified first alignment signal and the amplified second alignment signal to the first alignment pad and the second alignment pad through the first probe pins of the first electric-field-applying module.

The generating of the second alignment signal and the first emission timing signal may include generating a second emission timing signal having the same period as the second alignment signal, wherein the aligning of the light emitting elements by forming the electric field further includes irradiating light to the mother substrate by transmitting a second emission driving signal to light emitting diode arrays of a second light-irradiating module according to the second emission timing signal.

The method may further include forming a first electrode and a second electrode of each subpixel by cutting the first alignment line and the second alignment line, forming a first contact electrode that connects the first electrode and an end of each of the light emitting elements in each subpixel, and forming a second contact electrode that connects the second electrode and the other end of each of the light emitting elements in each subpixel.

According to the aforementioned and other embodiments of the present disclosure, ultraviolet light or blue light may be irradiated to display panel cells of a mother substrate through a light-irradiating module, and a first alignment signal and a second alignment signal may be transmitted to a first alignment line and a second alignment line of each of the display panel cells through a first electric-field-applying module and a second electric-field-applying module. In this case, active layers of light emitting elements of the display panel cells may be stimulated or excited by the ultraviolet light or the blue light of the light-irradiating module. Accordingly, a permanent dipole moment may be strongly generated in a direction from p-type doped second semiconductor layers toward n-type doped first semiconductor layers.

Therefore, because a dielectrophoretic force can be applied to the light emitting elements by an electric field, the light emitting elements may be aligned such that the second semiconductor layers are located toward the first alignment line. That is, the alignment accuracy of the light emitting elements can be increased.

According to the aforementioned and other embodiments of the present disclosure, a first emission driving signal of a second high level voltage may be transmitted at a time when the second alignment signal changes from a first low level voltage to a first high level voltage. Therefore, a first light-irradiating module may irradiate light to the mother substrate at a time when an electric field is applied to align the light emitting elements. Accordingly, a permanent dipole moment may be strongly generated in each of the light emitting elements at the time when the electric field is applied to align the light emitting elements. Therefore, because a dielectrophoretic force is applied to the light emitting elements by the electric field, the light emitting elements may be aligned such that the second semiconductor layers are located toward the first alignment line. That is, the alignment accuracy of the light emitting elements can be increased.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
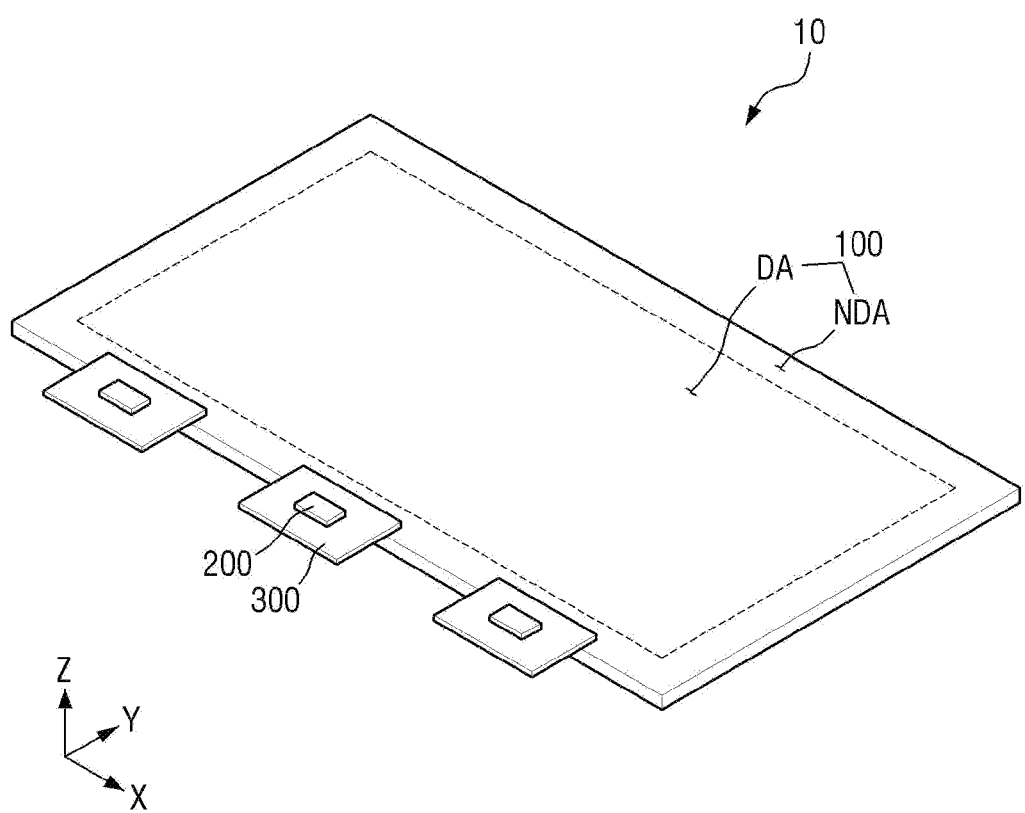
FIG. 1 is a perspective view of a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device 10 according to some embodiments.

Referring to FIG. 1, the display device 10 according to some embodiments is a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and the Internet of things (IoT).

In the present specification, the display device 10 according to some embodiments is, but not limited to, an inorganic light emitting display device including inorganic semiconductor elements as light emitting elements.

The display device 10 according to some embodiments includes a display panel 100, display driving circuits 200, and circuit boards 300.

The display panel 100 may be shaped like a rectangular plane having long sides in a first direction (X-axis direction) and short sides in a second direction (Y-axis direction) intersecting the first direction (X-axis direction). Each corner where a long side extending in the first direction (X-axis direction) meets a short side extending in the second direction (Y-axis direction) may be rounded with a curvature (e.g., with a predetermined curvature) or may be right-angled. The planar shape of the display panel 100 is not limited to a quadrangular shape, but may also be another polygonal shape, a circular shape, or an oval shape. The display panel 100 may be formed flat, but embodiments of the present specification are not limited thereto. For example, the display panel 100 may include a curved portion having a constant or varying curvature. Alternatively, the display panel 100 may be formed to be flexible so that it can be curved, bent, folded or rolled.

The display panel 100 may include a display area DA displaying an image and a non-display area NDA located around the display area DA. The display area DA may occupy most of the display panel 100. The display area DA may be located in or near the center of the display panel 100. In the display area DA, pixels PX (see FIG. 2) may be located to display an image.

The non-display area NDA may neighbor the display area DA. The non-display area NDA may be an area outside the display area DA. The non-display area NDA may surround the display area DA. The non-display area NDA may be an edge area of the display panel 100.

In the non-display area NDA, display pads DP (see FIG. 2) may be located for connection to the circuit boards 300. The display pads DP may be located on an edge of the display panel 100. For example, the display pads DP may be located on a lower edge of the display panel 100.

The circuit boards 300 may be located on the display pads DP located on an edge of the display panel 100. Although three circuit boards 300 are illustrated in FIG. 1, the number of circuit boards 300 according to some embodiments of the present specification is not limited thereto.

The circuit boards 300 may be attached to the display pads DP (see FIG. 2) and scan pads SP (see FIG. 2) by using a low-resistance, high-reliability material, such as an anisotropic conductive film or a self-assembly anisotropic conductive paste (SAP). Therefore, the circuit boards 300 may be electrically connected to data lines DL (see FIG. 2) and scan control lines SCL (see FIG. 2) of the display panel 100. The display panel 100 may receive data voltages and scan control signals through the circuit boards 300. The circuit boards 300 may be flexible printed circuit boards, printed circuit boards, or flexible films such as chip-on films.

The display driving circuits 200 may generate data voltages and scan control signals. The display driving circuits 200 may supply the data voltages and the scan control signals to the display panel 100 through the circuit boards 300. Alternatively, the scan control signals may be generated by a timing driving circuit, not the display driving circuits 200, and may be supplied to the display panel 100 through the circuit boards 300.

The display driving circuits 200 may be formed as integrated circuits and attached onto the circuit boards 300, respectively. Alternatively, the display driving circuits 200 may be attached onto the display panel 100 using a chip-on-glass (COG) method, a chip-on-plastic (COP) method, or an ultrasonic bonding method.

Figure 2:
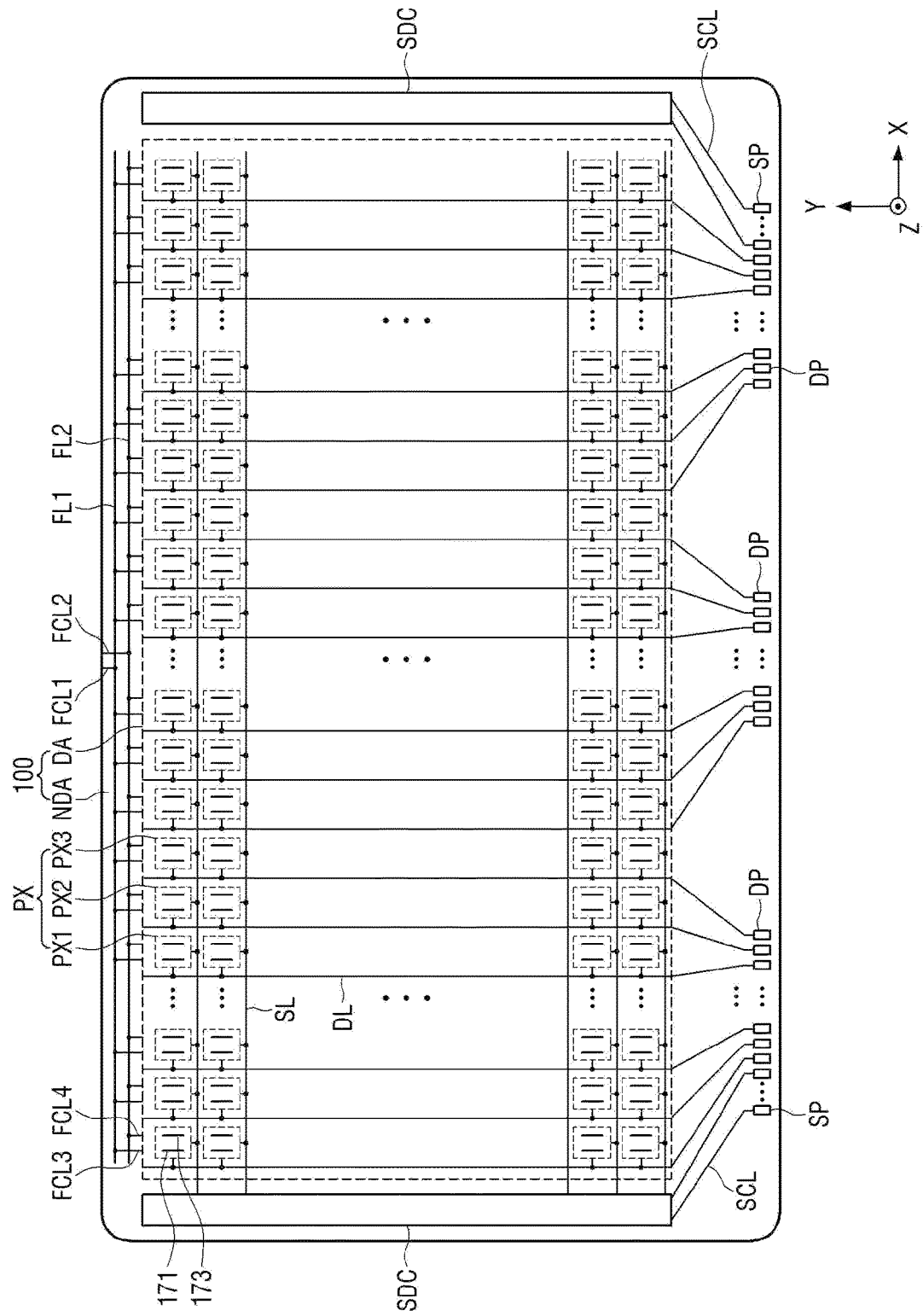
FIG. 2 is a layout view of an example of a display panel of FIG. 1.

FIG. 2 is a layout view of an example of the display panel 100 of FIG. 1.

Referring to FIG. 2, the display panel 100 may include the pixels PX, scan drivers SDC, scan lines SL, the data lines DL, floating lines FL1 and FL2, connection lines FCL1 through FCL4, the display pads DP, and the scan pads SP.

The pixels PX, the scan lines SL, and the data lines DL may be located in the display area DA of the display panel 100.

The scan lines SL may extend in the first direction (X-axis direction) and may be arranged in the second direction (Y-axis direction). The scan lines SL may be connected to the scan drivers SDC. Scan signals of the scan drivers SDC may be transmitted to the scan lines SL.

The data lines DL may extend in the second direction (Y-axis direction) and may be arranged in the first direction (X-axis direction). The data lines DL may be connected to the display pads DP. Therefore, the data lines DL may be electrically connected to the display driving circuits 200 of the circuit boards 300 through the display pads DP. Data voltages of the display driving circuits 200 may be applied to the data lines DL.

Each of the pixels PX may include a plurality of subpixels. In FIG. 2, each of the pixels PX includes three subpixels, that is, a first subpixel PX1, a second subpixel PX2, and a third subpixel PX3. However, the number of subpixels included in each of the pixels PX is not limited thereto. For example, each of the pixels PX may include four subpixels.

The subpixels PX1 through PX3 may be arranged in the first direction (X-axis direction) and the second direction (Y-axis direction). That is, the subpixels PX1 through PX3 may be arranged in a matrix form. The first subpixels PX1, the second subpixels PX2, and the third subpixels PX3 may be alternately arranged in the first direction (X-axis direction). The first subpixels PX1 may be arranged in the second direction (Y-axis direction), the second subpixels PX2 may be arranged in the second direction (Y-axis direction), and the third subpixels PX3 may be arranged in the second direction (Y-axis direction).

Each of the subpixels PX1 through PX3 may include a first electrode 171 and a second electrode 173. The first electrode 171 and the second electrode 173 may extend in the second direction (Y-axis direction) and neighbor each other in the first direction (X-axis direction).

The first electrodes 171 and the second electrodes 173 of the subpixels PX1 through PX3 may be spaced apart from each other. For example, the first electrode 171 of any one subpixel may be spaced apart from the first electrodes 171 of other subpixels adjacent to the subpixel in the first direction (X-axis direction) and adjacent to the subpixel in the second direction (Y-axis direction). In addition, the second electrode 173 of any one subpixel may be spaced apart from the second electrodes 173 of other subpixels adjacent to the subpixel in the first direction (X-axis direction) and adjacent to the subpixel in the second direction (Y-axis direction).

Light emitting elements 172 (see FIG. 3) may be located between the first electrode 171 and the second electrode 173 of each of the subpixels PX1 through PX3. A first end of each of the light emitting elements 172 (see FIG. 3) may be electrically connected to the first electrode 171, and a second end may be electrically connected to the second electrode 173. Therefore, the light emitting elements 172 (see FIG. 3)

may emit light according to a driving current flowing from the first electrode 171 to the second electrode 173.

The scan drivers SDC, the scan control lines SCL, the floating lines FL1 and FL2, the connection lines FCL1 through FCL4, the display pads DP, and the scan pads SP may be located in the non-display area NDA of the display panel 100.

The scan drivers SDC are connected to the scan pads SP through the scan control lines SCL. Therefore, the scan drivers SDC may be electrically connected to the circuit boards 300 through the scan pads SP. Accordingly, scan control signals of the circuit boards 300 may be transmitted to the scan drivers SDC. The scan drivers SDC may generate scan signals according to the scan control signals and may supply the scan signals to the scan lines SL.

Although the scan drivers SDC are located in the non-display area NDA outside left and right sides of the display area DA in FIG. 2, embodiments of the present specification are not limited thereto. For example, the scan driver SDC may be located in the non-display area NDA outside the left side or the right side of the display area DA.

The floating lines FL1 and FL2 and the connection lines FCL1 through FCL4 correspond to components remaining in the display panel 100 after a first alignment signal and a second alignment signal are transmitted to align the light emitting elements 172 during a manufacturing process. Therefore, the floating lines FL1 and FL2 and the connection lines FCL1 through FCL4 may be electrically isolated without being connected to other components of the display panel 100, for example, the first electrode 171 and the second electrode 173 of each of the subpixels PX1 through PX3, the scan lines SL, and the data lines DL. No voltage may be applied to the floating lines FL1 and FL2 and the connection lines FCL1 through FCL4 in some embodiments. Alternatively, a ground voltage or a direct current (DC) voltage having a level (e.g., a predetermined level) may be applied to the floating lines FL1 and FL2 and the connection lines FCL1 through FCL4 so as to reduce or prevent static electricity.

The floating lines FL1 and FL2 may extend in the first direction (X-axis direction) and may be arranged in the second direction (Y-axis direction). The floating lines FL1 and FL2 may be located in the non-display area NDA outside an upper side of the display area DA.

Figure 6:
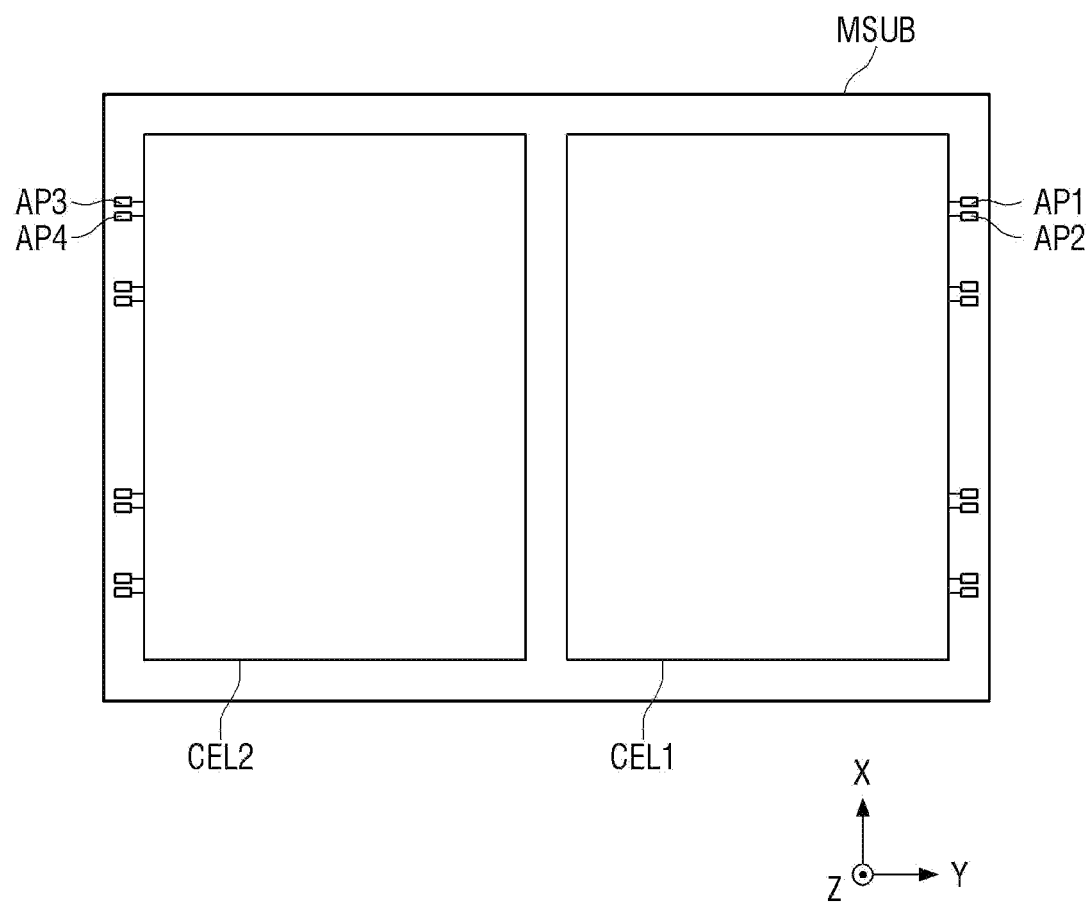
FIG. 6 is a layout view of a mother substrate according to some embodiments.

A first floating line FL1 among the floating lines FL1 and FL2 may be connected to first connection lines FCL1 and to third connection lines FCL3. The first connection lines FCL1 and the third connection lines FCL3 may extend in the second direction (Y-axis direction). The first connection lines FCL1 may extend from the first floating line FL1 toward an upper side of the display panel 100. The third connection lines FCL3 may extend from the first floating line FL1 toward the display area DA. The first connection lines FCL1 may be connected to first alignment pads AP1 of a mother substrate MSUB as illustrated in FIG. 6.

A second floating line FL2 among the floating lines FL1 and FL2 may be connected to second connection lines FCL2 and fourth connection lines FCL4. The second connection lines FCL2 and the fourth connection lines FCL4 may extend in the second direction (Y-axis direction). The second connection lines FCL2 may extend from the second floating line FL2 toward the upper side of the display panel 100. The fourth connection lines FCL4 may extend from the second floating line FL2 toward the display area DA. The second connection lines FCL2 may be connected to second alignment pads AP2 of the mother substrate MSUB as illustrated in FIG. 6.

The display pads DP and the scan pads SP may be located in the non-display area NDA outside a lower side of the display area DA. Each of the circuit boards 300 located on the left side and the right side may be connected to the display pads DP and the scan pads SP, whereas the circuit board 300 located in the center is connected to the display pads DP. The scan pads SP connected to the circuit board 300 located on the left side may be located on the left side of the display pads DP. The scan pads SP connected to the circuit board 300 located on the right side may be located on the right side of the display pads DP.

Figure 3:
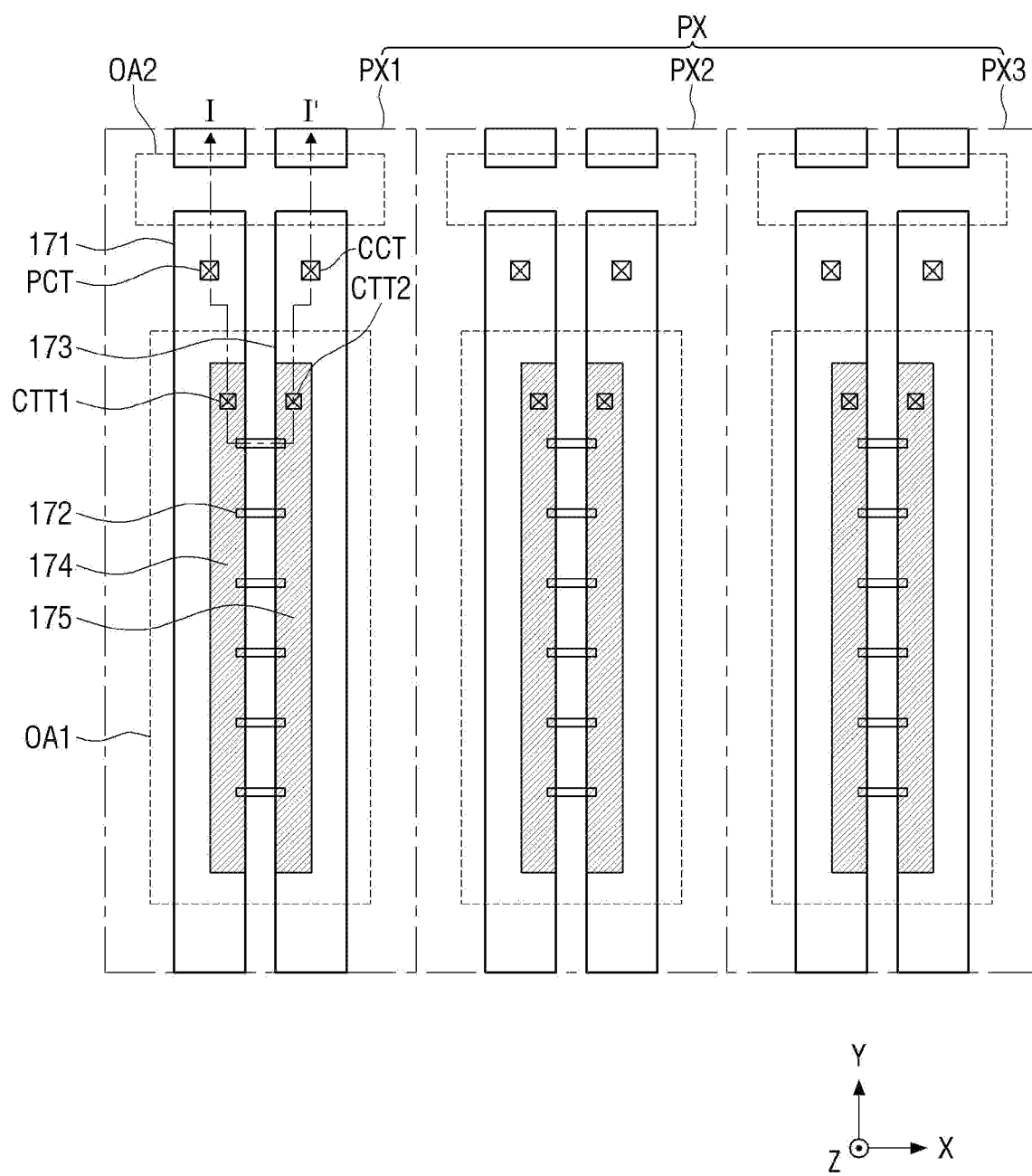
FIG. 3 is a layout view of an example of a pixel of FIG. 2.

FIG. 3 is a layout view of an example of a pixel of FIG. 2.

Referring to FIG. 3, each pixel PX includes a plurality of subpixels PX1 through PX3. In the present specification, each pixel PX includes three subpixels, that is, the first subpixel PX1, the second subpixel PX2, and the third subpixel PX3. However, embodiments of the present specification are not limited thereto.

The first subpixel PX1 may indicate a minimum unit that emits light of a first color, the second subpixel PX2 may indicate a minimum unit that emits light of a second color, and the third subpixel PX3 may indicate a minimum unit that emits light of a third color. The first color may be red, the second color may be green, and the third color may be blue, but embodiments of the present specification are not limited thereto. For example, the light of the first color may be red light having a central wavelength band of about 600 to about 750 nm, the light of the second color may be green light having a central wavelength band of about 480 to about 560 nm, and the light of the third color may be blue light having a central wavelength band of about 370 to about 490 nm.

Each of the first subpixel PX1, the second subpixel PX2, and the third subpixel PX3 may include the first electrode 171, the light emitting elements 172, the second electrode 173, a first contact electrode 174, and a second contact electrode 175.

The first electrode 171 may be a pixel electrode separate for each subpixel PX1, PX2, or PX3, and the second electrode 173 may be a common electrode separate for each subpixel PX1, PX2, or PX3. For example, the first electrode 171 may be an anode electrically connected to the first ends of the light emitting elements 172, and the second electrode 173 may be a cathode electrically connected to the second ends of the light emitting elements 172.

The first electrode 171 and the second electrode 173 may extend in the second direction (Y-axis direction). The first electrode 171 and the second electrode 173 may be spaced apart from each other and may be electrically separated from each other.

The first electrode 171 may be electrically connected to a source electrode or a drain electrode of a thin-film transistor ST (see FIG. 5) through a pixel contact hole PCT. The second electrode 173 may be electrically connected to a first power line VL1 (see FIG. 5) through a common contact hole CCT.

Although each of the subpixels PX1 through PX3 includes one first electrode 171 and one second electrode 173 in FIG. 3, embodiments of the present specification are not limited thereto. In other embodiments, each of the subpixels PX1 through PX3 may also include two or more first electrodes 171 and two second electrodes 173. Alternatively, each of the subpixels PX1 through PX3 may include two first electrodes 171 and one second electrode 173 in other embodiments.

The first contact electrode 174 and the second contact electrode 175 may extend in the second direction (Y-axis direction). A length of the first contact electrode 174 in the second direction (Y-axis direction) may be less than a length of the first electrode 171 in the second direction (Y-axis direction). A length of the second contact electrode 175 in the second direction (Y-axis direction) may be less than a length of the second electrode 173 in the second direction (Y-axis direction). In addition, a width (in the first direction (X-axis direction)) of the first contact electrode 174 may be less than a width (in the first direction (X-axis direction)) of the first electrode 171. A width (in the first direction (X-axis direction)) of the second contact electrode 175 may be less than a width (in the first direction (X-axis direction)) of the second electrode 173.

The first contact electrode 174 may overlap the first electrode 171 in a third direction (Z-axis direction). The first contact electrode 174 may be connected to the first electrode 171 through a first contact hole CTT1.

The second contact electrode 175 may overlap the second electrode 173 in the third direction (Z-axis direction). The second contact electrode 175 may be connected to the second electrode 173 through a second contact hole CTT2.

The first contact electrode 174 may contact the first ends of the light emitting elements 172. The second contact electrode 175 may contact the second ends of the light emitting elements 172. Accordingly, the light emitting elements 172 may be electrically connected to the first electrode 171 through the first contact electrode 174, and may be electrically connected to the second electrode 173 through the second contact electrode 175.

The light emitting elements 172 may be spaced apart from each other. The light emitting elements 172 may extend in the first direction (X-axis direction), and may be arranged in the second direction (Y-axis direction).

Figure 5:
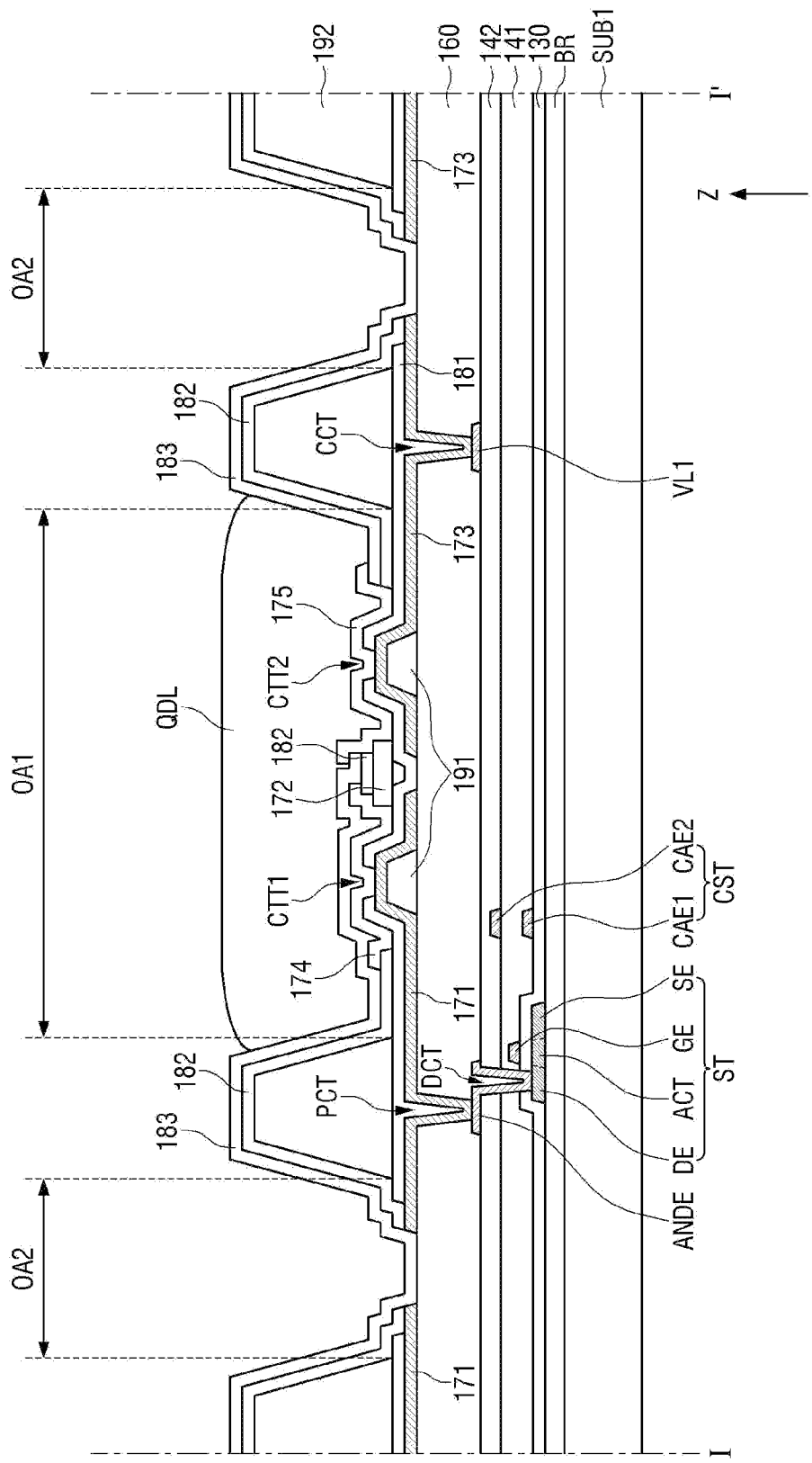
FIG. 5 is a cross-sectional view of an example of the display panel taken along the line I-I' of FIG. 3.

The light emitting elements 172 may be located in a first opening OA1 defined by an outer bank 192 (see FIG. 5). That is, the light emitting elements 172 might not overlap the outer bank 192 (see FIG. 5) in the third direction (Z-axis direction).

The first end of each of the light emitting elements 172 may contact the first contact electrode 174, and the second end may contact the second contact electrode 175. The first end of each of the light emitting elements 172 may overlap the first electrode 171 in the third direction (Z-axis direction), and the second end may overlap the second electrode 173 in the third direction (Z-axis direction).

Each of the light emitting elements 172 may be shaped like a rod, a wire, a tube, or the like. For example, each of the light emitting elements 172 may be shaped like a cylinder or a rod. Alternatively, each of the light emitting elements 172 may be shaped like a polyhedron, such as a cube or a rectangular parallelepiped, or a polygonal prism, such as a hexagonal prism. Alternatively, each of the light emitting elements 172 may be shaped like a truncated cone extending in one direction and having a partially inclined outer surface. A length of each of the light emitting elements 172 may be in the range of about 1 μm to about 10 μm, or about 2 μm to about 6 μm, for example, in the range of about 3 μm to about 5 μm. In addition, a diameter of each of the light emitting elements 172 may be in the range of about 300 nm to 700 nm, and an aspect ratio of each of the light emitting elements 172 may be about 1.2 to about 100.

The outer bank 192 (see FIG. 5) may define the first opening OA1 and a second opening OA2 in each of the subpixels PX1 through PX3. The first opening OA1 may be an emission area in which the light emitting elements 172 of each of the subpixels PX1 through PX3 are located. The second opening OA2 may be a separation area in which each of the first and second electrodes 171 and 173 is separated. In the second opening OA2, the first electrodes 171 of subpixels adjacent in the second direction (Y-axis direction) may be spaced apart from each other. In the second opening OA2, the second electrodes 173 of subpixels adjacent in the second direction (Y-axis direction) may be spaced apart from each other. A minimum distance between the first electrodes 171 in the second direction (Y-axis direction) in the second opening OA2 may be less than a maximum width of the second opening OA2 in the second direction (Y-axis direction). A minimum distance between the second electrodes 173 in the second direction (Y-axis direction) in the second opening OA2 may be less than the maximum width of the second opening OA2 in the second direction (Y-axis direction).

Although the first opening OA1 and the second opening OA2 are spaced apart from each other in FIG. 3, embodiments of the present specification are not limited thereto. The first opening OA1 and the second opening OA2 may also be formed as one opening.

Figure 4:
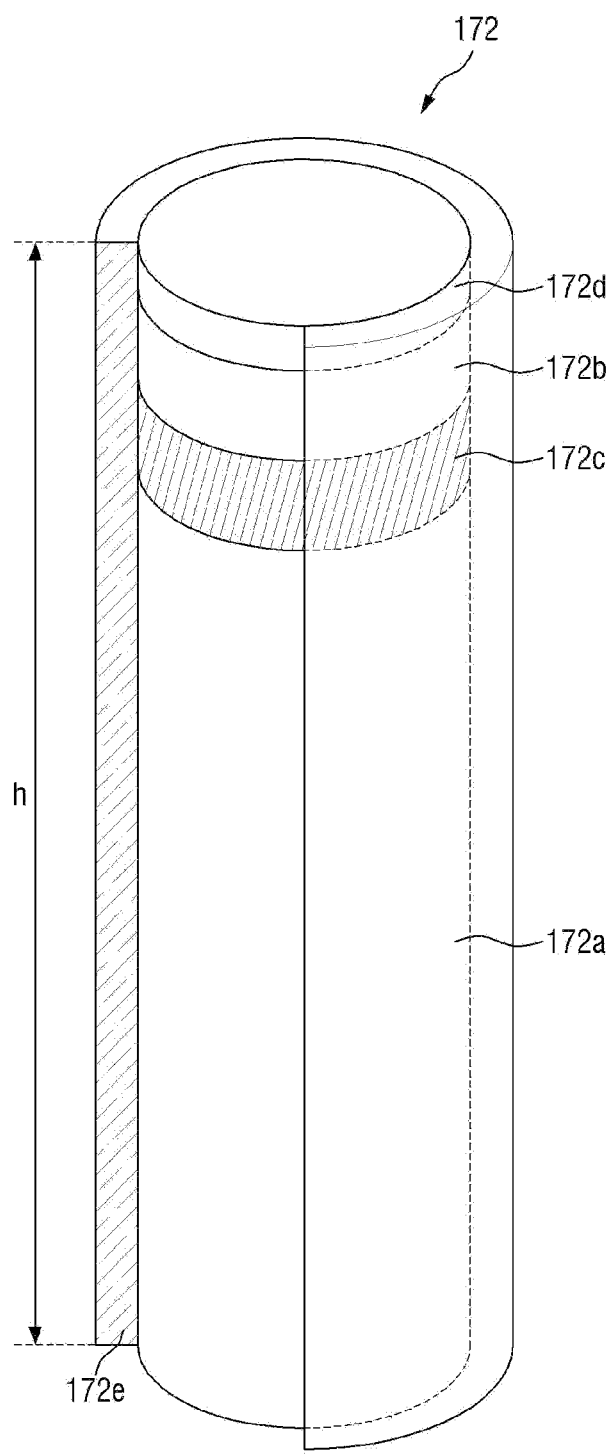
FIG. 4 illustrates an example of a light emitting element of FIG. 3.

FIG. 4 illustrates an example of a light emitting element 172 of FIG. 3.

Referring to FIG. 4, a light emitting element 172 may include a first semiconductor layer 172a, a second semiconductor layer 172b, an active layer 172c, an electrode layer 172d, and an insulating film 172e.

The light emitting element 172 according to some embodiments may extend in one direction. The light emitting element 172 may be shaped like a rod, a wire, a tube, or the like. In some embodiments, the light emitting element 172 may be shaped like a cylinder or a rod. However, the shape of the light emitting element 172 is not limited thereto, and the light emitting element 172 may also have various shapes including polygonal prisms, such as a cube, a rectangular parallelepiped, and a hexagonal prism, and a shape extending in a direction and having a partially inclined outer surface.

The light emitting element 172 may include a semiconductor layer doped with impurities of any conductivity type (e.g., a p type or an n type). The semiconductor layer may receive an electrical signal from an external power source and may emit light of a corresponding wavelength band. A plurality of semiconductors included in the light emitting element 172 may be sequentially located or stacked along the one direction.

The light emitting element 172 may include the first semiconductor layer 172a, the second semiconductor layer 172b, the active layer 172c, the electrode layer 172d, and the insulating film 172e. In FIG. 4, a portion of the insulating film 172e is removed to show each component of the light emitting element 172. Accordingly, the first semiconductor layer 172a, the second semiconductor layer 172b, the active layer 172c, and the electrode layer 172d are exposed, and the insulating film 172e may surround outer surfaces of the first semiconductor layer 172a, the second semiconductor layer 172b, the active layer 172c, and the electrode layer 172d.

The first semiconductor layer 172a may be an n-type semiconductor. For example, when the light emitting element 172 emits light in a blue wavelength band, the first semiconductor layer 172a may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 172a may be any one or more of n-type doped AlGaInN, GaN, AlGaN, InGaN, AlN, and InN. The first semiconductor layer 172a may be doped with an n-type dopant such as Si, Ge, or Sn. In some embodiments, the first semiconductor layer 172a may be n-GaN doped with n-type Si. A length of the first semiconductor layer 172a may be, but is not limited to, in the range of about 1.5 to about 5 µm.

The second semiconductor layer 172b is located on the active layer 172c to be described later. The second semiconductor layer 172b may be a p-type semiconductor. For example, when the light emitting element 172 emits light in a blue or green wavelength band, the second semiconductor layer 172b may include a semiconductor material having a chemical formula of $Al_xGa_yIn1-x-yN$ ($0≤x≤1$, $0≤y≤1$, $0≤x+y≤1$). For example, the second semiconductor layer 172b may be any one or more of p-type doped AlGaInN, GaN, AlGaN, InGaN, AlN, and InN. The second semiconductor layer 172b may be doped with a p-type dopant such as Mg, Zn, Ca, Se, or Ba. In some embodiments, the second semiconductor layer 172b may be p-GaN doped with p-type Mg. A length of the second semiconductor layer 172b may be, but is not limited to, in the range of about 0.05 µm to about 0.10 µm.

Although each of the first semiconductor layer 172a and the second semiconductor layer 172b is a single layer in FIG. 4, embodiments of the present specification are not limited thereto. For example, each of the first and second semiconductor layers 172a and 172b may include more layers, for example, may further include a clad layer or a tensile strain barrier reducing (TSBR) layer depending on the material of the active layer 172c.

The active layer 172c may be located between the first semiconductor layer 172a and the second semiconductor layer 172b. The active layer 172c may include a material having a single or multiple quantum well structure. When the active layer 172c includes a material having a multiple quantum well structure, it may have a structure in which quantum layers and well layers are alternately stacked. The active layer 172c may emit light through combination of electron-hole pairs according to electrical signals received through the first semiconductor layer 172a and the second semiconductor layer 172b. For example, when the active layer 172c emits light in the blue wavelength band, it may include a material such as AlGaN or AlGaInN. For example, when the active layer 172c has a multiple quantum well structure in which a quantum layer and a well layer are alternately stacked, the quantum layer may include a material such as AlGaN or AlGaInN, and the well layer may include a material such as GaN or AlInN. In some embodiments, the active layer 172c may include AlGaInN as a quantum layer and AlInN as a well layer to emit blue light having a central wavelength band of about 370 nm to about 490 nm.

However, embodiments of the present specification are not limited thereto, and the active layer 172c may also have a structure in which a semiconductor material having a large band gap energy and a semiconductor material having a small band gap energy are alternately stacked or may include different group 3 to 5 semiconductor materials depending on the wavelength band of light that it emits. Light emitted from the active layer 172c is not limited to light in the blue wavelength band, and the active layer 172c may also emit light in red and green wavelength bands. A length of the active layer 172c may be, but is not limited to, in the range of about 0.05 µm to about 0.10 µm.

Light emitted from the active layer 172c may be radiated not only to the outer surface of the light emitting element 172 in a longitudinal direction, but also to both side surfaces of the light emitting element 172. That is, the direction of light emitted from the active layer 172c is not limited to one direction.

The electrode layer 172d may be an ohmic contact electrode. However, embodiments of the present specification are not limited thereto, and the electrode layer 172d may also be a Schottky contact electrode. The light emitting element 172 may include at least one electrode layer 172d. Although the light emitting element 172 includes one electrode layer 172d in FIG. 4, it may also include two or more electrode layers 172d. Alternatively, the electrode layer 172d may be omitted from the light emitting element 172.

When the first end of the light emitting element 172 contacts the first contact electrode 174, the electrode layer 172d may reduce the resistance between the light emitting element 172 and the first contact electrode 174. The electrode layer 172d may include a conductive metal. For example, the electrode layer 172d may include at least any one of aluminum (Al), titanium (Ti), indium (In), gold (Au), silver (Ag), indium tin oxide (ITO), indium zinc oxide (IZO), and indium tin zinc oxide (ITZO). In addition, the electrode layer 172d may include an n-type or p-type doped semiconductor material. A length of the electrode layer 172d may be, but is not limited to, in the range of about 0.05 µm to about 0.10 µm.

The insulating film 172e surrounds the outer surfaces of the first semiconductor layer 172a, the second semiconductor layer 172b, the active layer 172c, and the electrode layer 172d. The insulating film 172e may protect the first semiconductor layer 172a, the second semiconductor layer 172b, the active layer 172c, and the electrode layer 172d. For example, the insulating film 172e may expose both ends of the light emitting element 172 in the longitudinal direction.

In FIG. 4, the insulating film 172e extends in the longitudinal direction of the light emitting element 172 to cover from the first semiconductor layer 172a to the electrode layer 172d. However, embodiments of the present specification are not limited thereto. The insulating film 172e may also cover the outer surface of the active layer 172c and only a respective portion of the outer surface of each of the first semiconductor layer 172a and the second semiconductor layer 172b. Alternatively, the insulating film 172e may cover a portion of the outer surface of the electrode layer 172d, so that the outer surface of the electrode layer 172d is partially exposed without being covered by the insulating film 172e.

A thickness of the insulating film 172e may be in the range of about 10 nm to about 1.0 µm, but is not limited thereto. The thickness of the insulating film 172e may for example be about 40 nm.

The insulating film 172e may include a material having insulating properties, such as silicon oxide (SiOx), silicon nitride (SiNx), silicon oxynitride (SiOxNy), aluminum nitride (AlN), or aluminum oxide ($Al_2O_3$). Accordingly, the insulating film 172e may reduce or prevent the likelihood of an electrical short circuit that may occur when the active layer 172c directly contacts the first contact electrode 174 or the second contact electrode 175. In addition, the insulating film 172e may prevent a reduction in luminous efficiency by protecting the outer surface of the light emitting element 172 including the active layer 172c.

In addition, the light emitting element 172 may be included in a coating solution (e.g., a predetermined coating solution) when the display device 10 is manufactured. Here, the surface of the insulating film 172e may be hydrophobic or hydrophilic-treated so that the light emitting element 172 remains separate from other adjacent light emitting elements 172 in the coating solution without being agglomerated with them.

A length h of the light emitting element 172 may be about 1 µm to about 10 µm or about 2 µm to about 6 µm, for example, about 3 µm to about 5 µm. In addition, the diameter of the light emitting element 172 may be in the range of about 30 nm to about 700 nm, and the aspect ratio of the light emitting element 172 may be about 1.2 to about 100. However, the light emitting elements 172 may have different diameters according to a difference in the composition of the active layer 172c. Preferably, the diameter of the light emitting element 172 may be about 500 nm.

FIG. 5 is a cross-sectional view of an example of the display panel 100 taken along the line I-I' of FIG. 3.

Referring to FIG. 5, the first subpixel PX1 may include at least one thin-film transistor ST, at least one capacitor CST, the first electrode 171, the light emitting elements 172, the second electrode 173, the first contact electrode 174, the second contact electrode 175, and a wavelength conversion layer QDL.

A substrate SUB1 may be made of an insulating material, such as glass, quartz, or polymer resin. The substrate SUB1 may be a rigid substrate, or may be a flexible substrate that can be bent, folded, rolled, and the like.

A barrier layer BR may be located on the substrate SUB1. The barrier layer BR is a layer for protecting the thin-film transistor ST from moisture introduced through the substrate SUB1, which may be vulnerable to moisture permeation. The barrier layer BR may be composed of a plurality of inorganic layers stacked alternately. For example, the barrier layer BR may be a multilayer in which inorganic layers including at least any one of silicon oxide (SiOx), silicon nitride (SiNx), and silicon oxynitride (SiOxNy) are alternately stacked.

A semiconductor layer including an active layer ACT, a source electrode SE, and a drain electrode DE of the thin-film transistor ST may be located on the barrier layer BR. The semiconductor layer may include polycrystalline silicon, monocrystalline silicon, low-temperature polycrystalline silicon, amorphous silicon, or an oxide semiconductor. The source electrode SE and the drain electrode DE may be formed to have conductivity by doping a silicon semiconductor or an oxide semiconductor with ions or impurities. The active layer ACT may be overlapped by a gate electrode GE in the third direction (Z-axis direction), which is a thickness direction of the substrate SUB1, and the source electrode SE and the drain electrode DE might not be overlapped by the gate electrode GE in the third direction (Z-axis direction).

A gate insulating layer 130 may be located on the active layer ACT, the source electrode SE, and the drain electrode DE. The gate insulating layer 130 may include an inorganic layer, for example, silicon oxide (SiOx), silicon nitride (SiNx), or silicon oxynitride (SiOxNy).

A first gate conductive layer including the gate electrode GE of the thin-film transistor ST and a first capacitor electrode CAE1 of the capacitor CST may be located on the gate insulating layer 130. The gate electrode GE may overlap the active layer ACT in the third direction (Z-axis direction). The first gate conductive layer may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

A first interlayer insulating film 141 may be located on the gate electrode GE and the first capacitor electrode CAE1. The first interlayer insulating film 141 may include an inorganic layer, for example, silicon oxide (SiOx), silicon nitride (SiNx), or silicon oxynitride (SiOxNy).

A second gate conductive layer including a second capacitor electrode CAE2 of the capacitor CST may be located on the first interlayer insulating film 141. Because the first interlayer insulating film 141 has a dielectric constant (e.g., a predetermined dielectric constant), the capacitor CST may be formed by the first capacitor electrode CAE1, the second capacitor electrode CAE2, and the first interlayer insulating film 141. The second capacitor electrode CAE2 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

A second interlayer insulating film 142 may be located on the second capacitor electrode CAE2. The second interlayer insulating film 142 may include an inorganic layer, for example, silicon oxide (SiOx), silicon nitride (SiNx), or silicon oxynitride (SiOxNy).

A data conductive layer including a connection electrode ANDE and the first power line VL1 may be located on the second interlayer insulating film 142. The connection electrode ANDE may be connected to the drain electrode DE through a drain contact hole DCT penetrating the gate insulating layer 130, the first interlayer insulating film 141, and the second interlayer insulating film 142 to expose the drain electrode DE of the thin-film transistor ST. Although the connection electrode ANDE is connected to the drain electrode DE of the thin-film transistor ST in FIG. 4, embodiments of the present specification are not limited thereto. For example, the connection electrode ANDE may be connected to the source electrode SE through a source contact hole penetrating the gate insulating layer 130, the first interlayer insulating film 141, and the second interlayer insulating film 142 to expose the source electrode SE of the thin-film transistor ST. A first power supply voltage may be applied to the first power line VL1. The first power line VL1 may extend in the first direction (X-axis direction), but embodiments of the present specification are not limited thereto. The data conductive layer may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A planarization layer 160 may be located on the connection electrode ANDE to planarize steps formed by the thin-film transistors ST. The planarization layer 160 may be made of an organic layer such as acryl resin, epoxy resin, phenolic resin, polyamide resin, or polyimide resin.

The first electrode 171, the second electrode 173, and inner banks 191 may be located on the planarization layer 160.

The inner banks 191 may be located in the first opening OA1 defined by the outer bank 192. The light emitting elements 172 may be located between the inner banks 191 adjacent to each other. Each of the inner banks 191 may include a lower surface contacting the planarization layer 160, an upper surface opposite to the lower surface, and side surfaces between, or connecting, the upper surface and the lower surface. The inner banks 191 may have a trapezoidal cross-sectional shape, but is not limited thereto.

The inner banks 191 may be made of an organic layer such as photosensitive resin, acryl resin, epoxy resin, phenolic resin, polyamide resin, or polyimide resin. For example, when the inner banks 191 are made of photosensitive resin, they may be positive photoresists or negative photoresists.

The first electrode 171 may be located on the planarization layer 160 and an inner bank 191 (e.g., a respective inner bank). The first electrode 171 may be located on at least one side surface and the upper surface of the inner bank 191. The first electrode 171 may be connected to the connection electrode ANDE through the pixel contact hole PCT penetrating the planarization layer 160. Therefore, the first electrode 171 may be electrically connected to the drain electrode DE of the thin-film transistor ST. The pixel contact hole PCT may be overlapped by the outer bank 192 in the third direction (Z-axis direction). The pixel contact hole PCT may be located between the first opening OA1 and the second opening OA2.

The second electrode 173 may be located on the planarization layer 160 and an inner bank 191 (e.g., a respective inner bank). The second electrode 173 may be located on at least one side surface and the upper surface of the inner bank 191. The second electrode 173 may be connected to the first power line VL1 through the common contact hole CCT penetrating the planarization layer 160. The common contact hole CCT may be overlapped by an outer bank 192 in the third direction (Z-axis direction). The common contact hole CCT may be located between the first opening OA1 and the second opening OA2.

The first electrode 171 and the second electrode 173 may include a conductive material having high reflectivity. For example, the first electrode 171 and the second electrode 173 may include a metal such as silver (Ag), copper (Cu), or aluminum (Al). Therefore, of the light emitted from the light emitting elements 172, light traveling to the first electrode 171 and the second electrode 173 may be reflected by the first electrode 171 and the second electrode 173 toward a direction above the light emitting elements 172.

A first insulating layer 181 may be located on the first electrode 171 and the second electrode 173. The first insulating layer 181 may be located on the planarization layer 160 exposed without being covered by the first electrode 171 and the second electrode 173. The first insulating layer 181 may include an inorganic layer, for example, silicon oxide (SiOx), silicon nitride (SiNx), or silicon oxynitride (SiOxNy).

The outer bank 192 may be located on the first insulating layer 181. The outer bank 192 (e.g., respective outer banks) may define the first opening OA1 and the second opening OA2. The outer bank 192 might not overlap the inner banks 191. The outer bank 192 may include a lower surface contacting the first insulating layer 181, an upper surface opposite to the lower surface, and side surfaces between the upper surface and the lower surface. The outer bank 192 may have a trapezoidal cross-sectional shape, but is not limited thereto.

The outer bank 192 may be made of an organic layer such as photosensitive resin, acryl resin, epoxy resin, phenolic resin, polyamide resin, or polyimide resin. For example, when the inner banks 191 are made of photosensitive resin, the outer bank 192 may be a positive photoresist or a negative photoresist.

The light emitting elements 172 may be located on the first insulating layer 181. A second insulating layer 182 may be located on the light emitting elements 172. In addition, the second insulating layer 182 may be located on the outer bank 192. The second insulating layer 182 may be located on portions of the first electrode 171 and the second electrode 173 exposed and not covered by the first insulating layer 181 in the second opening OA2. The second insulating layer 182 may include an inorganic layer, for example, silicon oxide (SiOx), silicon nitride (SiNx), or silicon oxynitride (SiOxNy).

The first contact electrode 174 may be connected to the first electrode 171 through the first contact hole CTT1 penetrating the first insulating layer 181. The first contact hole CTT1 may overlap an inner bank 191 in the third direction (Z-axis direction). The first contact electrode 174 may contact the first ends of the light emitting elements 172. Therefore, the first ends of the light emitting elements 172 may be electrically connected to the first electrode 171 through the first contact electrode 174. The first contact electrode 174 may be located on the second insulating layer 182.

A third insulating layer 183 may be located on the first contact electrode 174. The third insulating layer 183 may cover the first contact electrode 174 to electrically separate the first contact electrode 174 and the second contact electrode 175. In addition, the third insulating layer 183 may cover the second insulating layer 182 located on the outer bank 192. Further, the third insulating layer 183 may be located in a separation area of the first electrode 171 and a separation area of the second electrode 173 in the second opening OA2. That is, the third insulating layer 183 may be located on the planarization layer 160 exposed and not covered by the first electrode 171 and the second electrode 173 in the second opening OA2. The third insulating layer 183 may include an inorganic layer, for example, silicon oxide (SiOx), silicon nitride (SiNx), or silicon oxynitride (SiOxNy).

The second contact electrode 175 may be connected to the second electrode 173 through the second contact hole CTT2 penetrating the first insulating layer 181. The second contact hole CTT2 may overlap an inner bank 191 in the third direction (Z-axis direction). The second contact electrode 175 may contact the second ends of the light emitting elements 172. Therefore, the second ends of the light emitting elements 172 may be electrically connected to the second electrode 173 through the second contact electrode 175. The second contact electrode 175 may be located on the third insulating layer 183.

The first contact electrode 174 and the second contact electrode 175 may be made of a transparent conductive oxide (TCO) capable of transmitting light, such as indium tin oxide (ITO) or indium zinc oxide (IZO). Therefore, it is possible to reduce or prevent light emitted from the light emitting elements 172 from being blocked by the first contact electrode 174 and the second contact electrode 175.

The first end of each of the light emitting elements 172 is electrically connected to the drain electrode DE of the thin-film transistor ST through the first contact electrode 174 and the first electrode 171, and the second end is connected to the first power line VL1 through the second contact electrode 175 and the second electrode 173. Therefore, each of the light emitting elements 172 may emit light according to a current flowing from the first end to the second end.

The first wavelength conversion layer QDL may be located in the first subpixel PX1, a second wavelength conversion layer may be located in the second subpixel PX2, and a transparent insulating layer may be located in the third subpixel PX3. The light emitting elements 172 of each of the first subpixel PX1, the second subpixel PX2, and the third subpixel PX3 may emit third light. The third light may be short-wavelength light such as blue light or ultraviolet light having a central wavelength band of about 370 nm to about 490 nm.

The first wavelength conversion layer QDL may convert the third light emitted from the light emitting elements 172 of the first subpixel PX1 into first light. The first light may be red light having a central wavelength band of about 600 nm to about 750 nm.

The second wavelength conversion layer may convert the third light emitted from the light emitting elements 172 of the second subpixel PX2 into second light. The second light may be red light having a central wavelength band of about 480 nm to about 560 nm.

Each of the first wavelength conversion layer QDL and the second wavelength conversion layer may include a base resin, wavelength shifters, and scatterers.

The base resin may be a material having high light transmittance and superior dispersion properties for the wavelength shifters and the scatterers. For example, the base resin may include an organic material such as epoxy resin, acrylic resin, cardo resin, or imide resin.

The wavelength shifters may convert or shift the wavelength range of incident light. The wavelength shifters may be quantum dots, quantum rods, or phosphors. The quantum dot size of the first wavelength conversion layer QDL and the quantum dot size of the second wavelength conversion layer may be different.

The scatterers may scatter incident light in random directions without substantially converting the wavelength of the light passing through the first wavelength conversion layer QDL or the second wavelength conversion layer. Accordingly, this may increase the length of the path of the light passing through the first wavelength conversion layer QDL or the second wavelength conversion layer, thereby increasing color conversion efficiency by the wavelength shifters. For example, the scatterers may be metal oxide particles such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$). Alternatively, the scatterers may be organic particles such as acrylic resin or urethane resin.

The transparent insulating layer may pass short-wavelength light, such as blue light or ultraviolet light, as it is. The transparent insulating layer may be made of an organic layer having high transmittance.

The first wavelength conversion layer QDL may be located on the second contact electrode 175 and the third insulating layer 183 in the first subpixel PX1. The position of the second wavelength conversion layer in the second subpixel PX2 and the position of the transparent insulating layer in the third subpixel PX3 are substantially the same as that of the first wavelength conversion layer QDL, and thus a description of the position of the second wavelength conversion layer and the position of the transparent insulating layer will be omitted.

A first color filter may be located on the first wavelength conversion layer QDL. The first color filter may transmit the first light, for example, light in the red wavelength band. Therefore, of the short-wavelength light emitted from the light emitting elements 172 of the first subpixel PX1, light not converted into the first light may be unable to pass through the first color filter. In contrast, light converted into the first light by the first wavelength conversion layer QDL may pass through the first color filter.

A second color filter may be located on the second wavelength conversion layer. The second color filter may transmit the second light, for example, light in the green wavelength band. Therefore, of the short-wavelength light emitted from the light emitting elements 172 of the second subpixel PX2, light that is not converted into the second light may be unable to pass through the second color filter. In contrast, light that is converted into the second light by the second wavelength conversion layer may pass through the second color filter.

A third color filter may be located on the transparent insulating layer. The third color filter may transmit the third light, for example, light in the blue wavelength band. Therefore, short-wavelength light emitted from the light emitting elements 172 of the third subpixel PX3 may pass through the third color filter.

A black matrix may be located on the color filters. The black matrix may be located between the color filters. The black matrix may include a light-blocking material capable of blocking light. In this case, the black matrix may include an inorganic black pigment such as carbon black or an organic black pigment.

The second subpixel PX2 and the third subpixel PX3 are substantially the same as the first subpixel PX1 described with reference to FIG. 5, except for the wavelength conversion layer QDL and the first color filter, and thus a description of the second subpixel PX2 and the third subpixel PX3 will be omitted.

Figure 7:
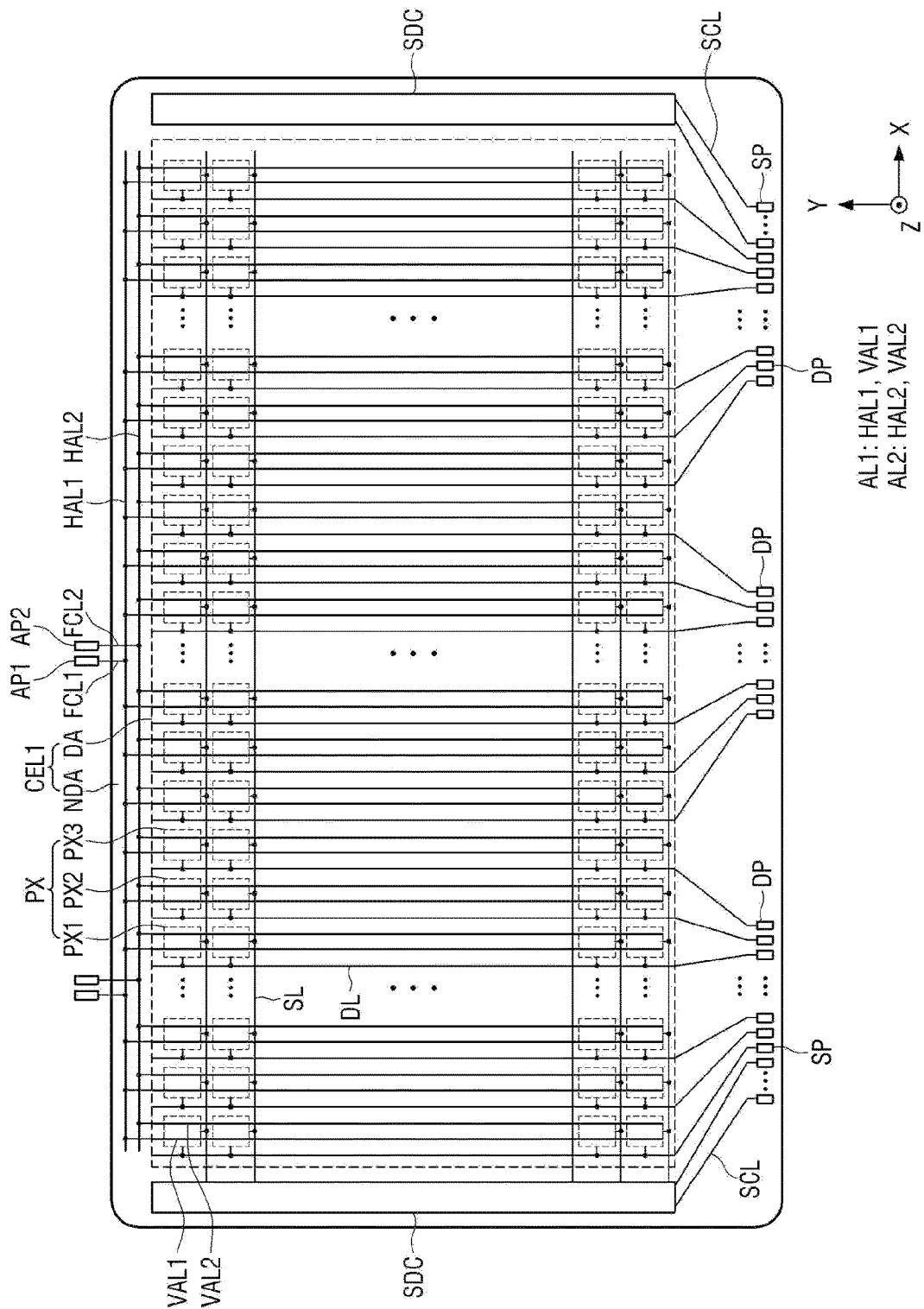
FIG. 7 is a layout view of an example of a first display panel cell, first alignment pads, and second alignment pads of FIG. 6.

FIG. 6 is a layout view of a mother substrate MSUB according to some embodiments, and FIG. 7 is a layout view of an example of a first display panel cell CEL1, first alignment pads AP1, and second alignment pads AP2 of FIG. 6.

Referring to FIGS. 6 and 7, the mother substrate MSUB may include the first display panel cell CEL1, a second display panel cell CEL2, the first alignment pads AP1, the second alignment pads AP2, third alignment pads AP3, and fourth alignment pads AP4. Although the mother substrate MSUB includes two display panel cells CEL1 and CEL2 in FIG. 6, the number of display panel cells CEL1 and CEL2 of the mother substrate MSUB is not limited thereto.

The first display panel cell CEL1 may be located in an area adjacent to a first side of the mother substrate MSUB, and the second display panel cell CEL2 may be located in an area adjacent to a second side of the mother substrate MSUB. The first display panel cell CEL1, the first alignment pads AP1 and the second alignment pads AP2 may be symmetrical to the second display panel cell CEL2, the third alignment pads AP3 and the fourth alignment pads AP4 in the second direction (Y-axis direction). For example, the first alignment pads AP1 and the second alignment pads AP2 may be located on a first side of the first display panel cell CEL1. The third alignment pads AP3 and the fourth alignment pads AP4 may be located on a second side of the second display panel cell CEL2.

The first display panel cell CEL1 may include pixels PX, scan drivers SDC, scan lines SL, data lines DL, a first alignment line AL1, a second alignment line AL2, first connection lines FCL1, second connection lines FCL2, display pads DP, and scan pads SP as illustrated in FIG. 7. The scan drivers SDC, the scan lines SL, the data lines DL, the display pads DP, and the scan pads SP illustrated in FIG. 7 are substantially the same as those described above with reference to FIG. 2, and thus will not be described again here.

The first alignment line AL1 includes a first horizontal alignment line HAL1 and first vertical alignment lines VAL1. The first horizontal alignment line HAL1 may be substantially the same as the first floating line FL1 described above with reference to FIG. 2. The first horizontal alignment line HAL1 may be connected to the first alignment pads AP1 through the first connection lines FCL1. The first vertical alignment lines VAL1 may extend from the first horizontal alignment line HAL1 in the second direction (Y-axis direction). The first vertical alignment lines VAL1 may be located in subpixels PX1 through PX3 arranged in the second direction (Y-axis direction).

The second alignment line AL2 includes a second horizontal alignment line HAL2 and second vertical alignment lines VAL2. The second horizontal alignment line HAL2 may be substantially the same as the second floating line FL2 described above with reference to FIG. 2. The second horizontal alignment line HAL2 may be connected to the second alignment pads AP2 through the second connection lines FCL2. The second vertical alignment lines VAL2 may extend from the second horizontal alignment line HAL2 in the second direction (Y-axis direction). The second vertical alignment lines VAL2 may be located in the subpixels PX1 through PX3 arranged in the second direction (Y-axis direction).

As illustrated in FIG. 7, the first alignment line AL1 is connected to the first alignment pads AP1 through the first connection lines FCL1, and the second alignment line AL2 is connected to the second alignment pads AP2 through the second connection lines FCL2. In addition, the first alignment line AL1 and the second alignment line AL2 are connected in common to all subpixels PX1 through PX3 of a display panel 100. A first alignment signal may be transmitted to the first alignment line AL1 through first probe pins and the first alignment pads AP1, and a second alignment signal may be transmitted to the second alignment line AL2 through the first probe pins and the second alignment pads AP2. In this case, light emitting elements 172 of all subpixels PX1 through PX3 of the display panel 100 may be aligned by an electric field formed by the first alignment signal of the first alignment line AL1 and the second alignment signal of the second alignment line AL2.

The first alignment line AL1 and the second alignment line AL2 may be cut after transmitting the first alignment signal and the second alignment signal to align the light emitting elements 172. Therefore, the first alignment line AL1 and the second alignment line AL2 may be divided into floating lines FL1 and FL2, connection lines FCL1 through FCL4, first electrodes 171, and second electrodes 173, as illustrated in FIG. 2.

In addition, the display panel cells CEL1 and CEL2 may be cut by a scribing process. Therefore, each of the display panel cells CEL1 and CEL2 may be formed as the display panel 100 illustrated in FIG. 2.

Because the second display panel cell CEL2 is substantially the same as the first display panel cell CEL1 described above with reference to FIG. 7, a description of the second display panel cell CEL2 will be omitted.

Figure 8:
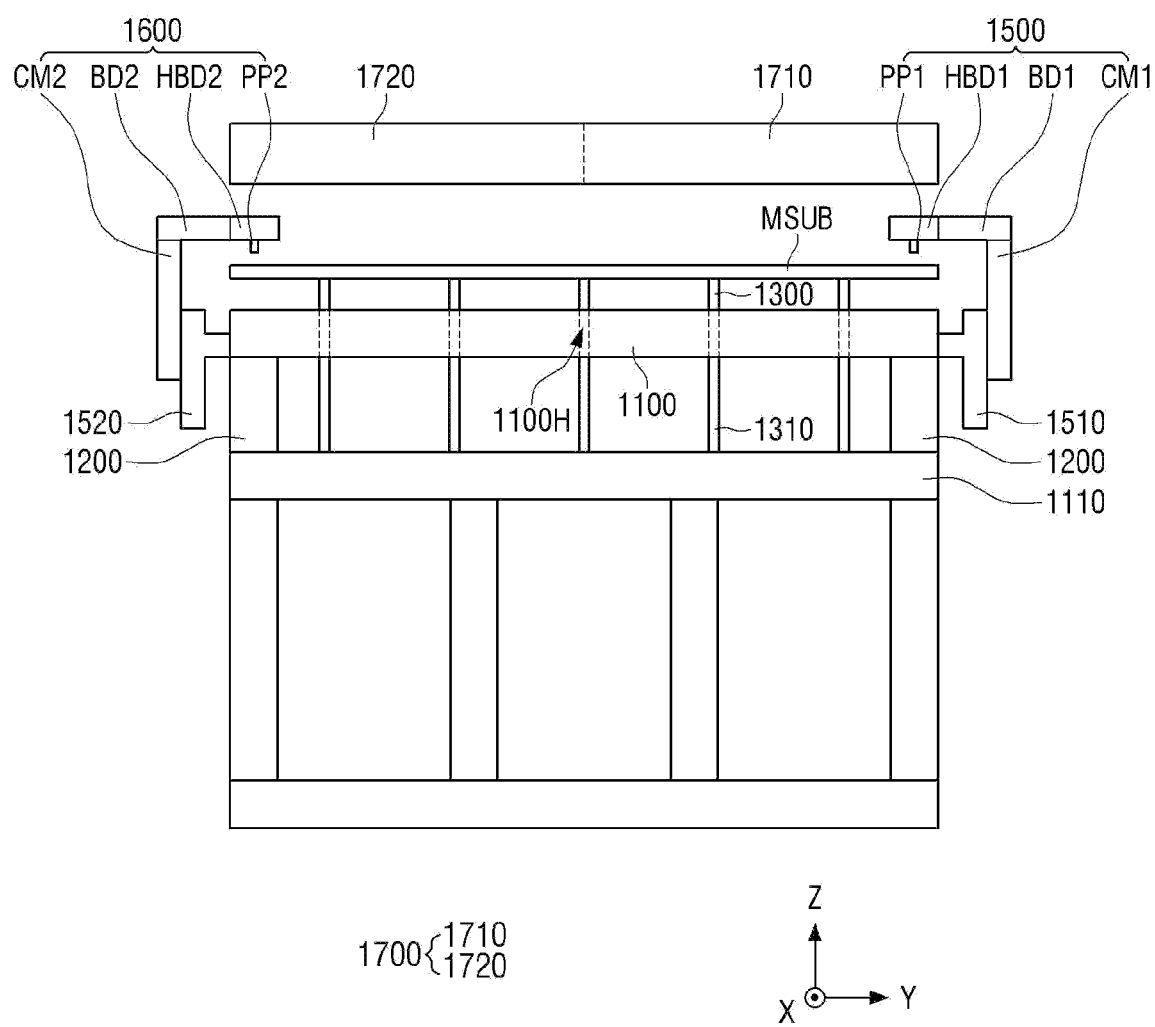
FIG. 8 illustrates an apparatus for manufacturing a display device according to some embodiments.
Figure 9:
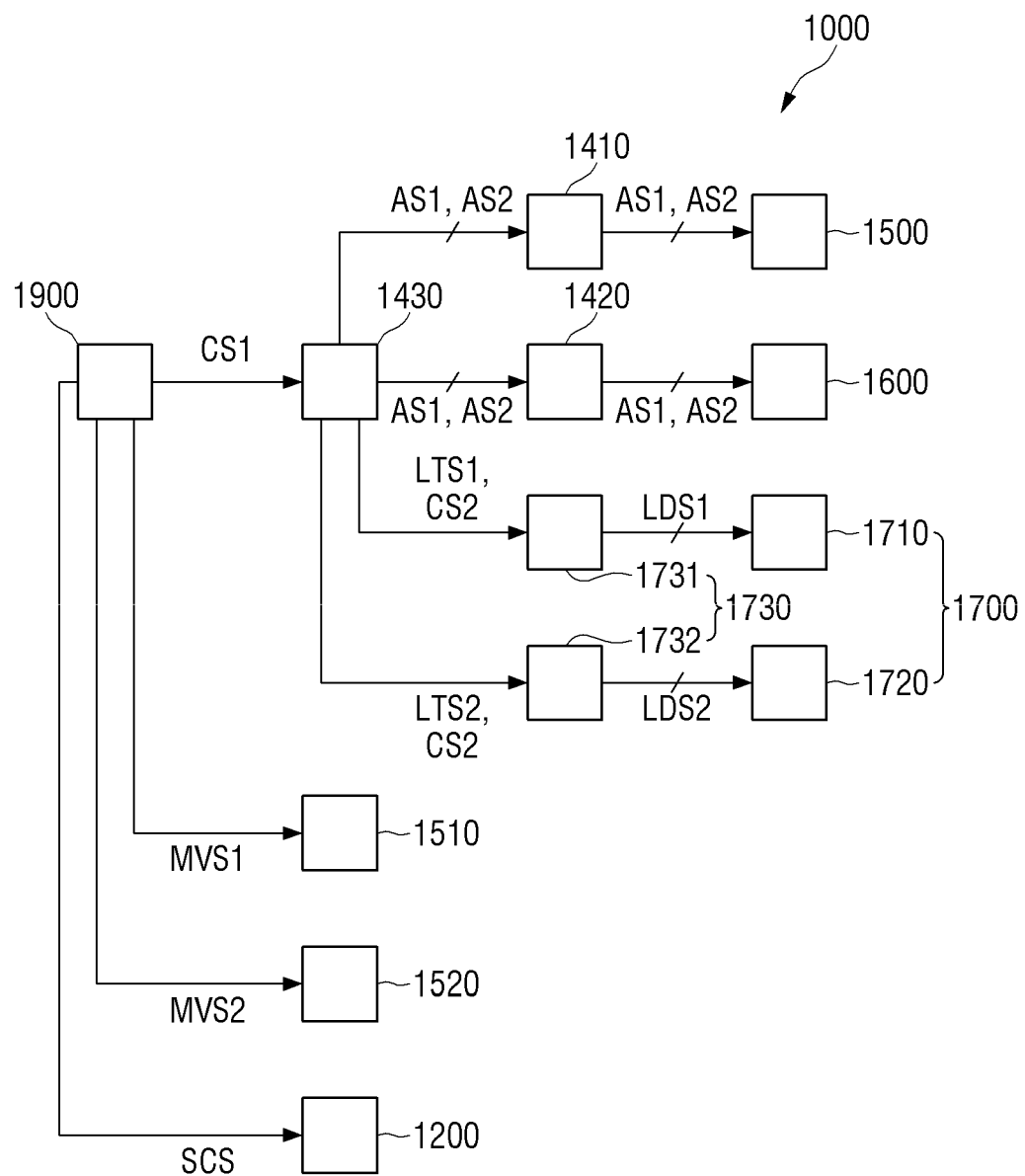
FIG. 9 is a block diagram of the apparatus for manufacturing a display device according to some embodiments.

FIG. 8 illustrates an apparatus 1000 for manufacturing a display device according to some embodiments, and FIG. 9 is a block diagram of the apparatus 1000 for manufacturing a display device according to some embodiments.

FIGS. 8 and 9 illustrate the manufacturing apparatus 1000 which transmits alignment signals to a mother substrate MSUB so as to align light emitting elements of subpixels of each of a plurality of display panel cells CEL1 and CEL2 of the mother substrate MSUB.

Referring to FIGS. 8 and 9, the apparatus 1000 for manufacturing a display device according to some embodiments includes a stage 1100, a stage support 1110, a stage moving unit 1200, support pins 1300, pin supports 1310, a first amplifier 1410, a second amplifier 1420, a voltage output unit 1430, a first electric-field-applying module 1500, a first module moving unit 1510, a second electric-field-applying module 1600, a second module moving unit 1520, a light-irradiating module 1700, and a control unit 1900.

The stage 1100 may include a flat upper surface so that the mother substrate MSUB can be stably mounted thereon. The stage 1100 may be raised or lowered by the stage moving unit 1200.

The stage 1100 may include stage holes 1100H. The stage holes 1100H may be holes penetrating the stage 1100. The support pins 1300 and/or the pin supports 1310 may be located in the stage holes 1100H. That is, the stage holes 1100H may overlap the support pins 1300 and the pin supports 1310. The stage holes 1100H may be arranged in the first direction (X-axis direction) and the second direction (Y-axis direction). For example, the stage holes 1100H may be arranged at first intervals in the first direction (X-axis direction) and may be arranged at second intervals in the second direction (Y-axis direction).

The stage moving unit 1200 may be coupled to the bottom of the stage 1100. The stage moving unit 1200 may lower or raise the stage 1100 according to a stage control signal SCS of the control unit 1900. To this end, the stage moving unit 1200 may include a motor as a power source for moving the stage 1100.

The stage moving unit 1200 may raise the stage 1100 (e.g., by a preset height) when receiving the stage control signal SCS of a first logic level voltage from the control unit 1900. The stage moving unit 1200 may lower the stage 1100 (e.g., by a preset height) when receiving the stage control signal SCS of a second logic level voltage from the control unit 1900.

The support pins 1300 may be pins that support the mother substrate MSUB when the mother substrate MSUB is put into, or removed from, the manufacturing apparatus 1000. The support pins 1300 may be connected to the pin supports 1310 located under the stage 1100 through the stage holes 1100H of the stage 1100.

When the stage 1100 is lowered by the stage moving unit 1200, the support pins 1300 may protrude from the upper surface of the stage 1100. When the stage 1100 is raised by the stage moving unit 1200, the support pins 1300 might not protrude from the upper surface of the stage 1100 because they are placed in the stage holes 1100H. Therefore, when the stage 1100 is raised by the stage moving unit 1200, the mother substrate MSUB may be mounted on the upper surface of the stage 1100.

The stage support 1110 may be located under the stage 1100 to support the stage 1100. The stage moving unit 1200 and the pin supports 1310 may be located on the stage support 1110. The stage support 1110 may have various known shapes other than the shape illustrated in FIG. 8.

The first amplifier 1410 may receive a first alignment signal AS1 and a second alignment signal AS2 from the voltage output unit 1430. The first amplifier 1410 may amplify the first alignment signal AS1 and/or the second alignment signal AS2 and may output the amplified first alignment signal AS1 and/or the amplified second alignment signal AS2 to first probe pins PP1 of the first electric-field-applying module 1500. For example, a voltage swing width of the first alignment signal AS1 and/or the second alignment signal AS2 input from the voltage output unit 1430 may be less than a voltage swing width of the first alignment signal AS1 and/or the second alignment signal AS2 output from the first amplifier 1410. When the first alignment signal AS1 is a ground voltage or a DC voltage that is close to the ground voltage, the first amplifier 1410 might not amplify the first alignment signal AS1.

The second amplifier 1420 may receive the first alignment signal AS1 and the second alignment signal AS2 from the voltage output unit 1430. The second amplifier 1420 may amplify the first alignment signal AS1 and/or the second alignment signal AS2 and may output the amplified first alignment signal AS1 and/or the amplified second alignment signal AS2 to second probe pins PP2 of the second electric-field-applying module 1600. For example, the voltage swing width of the first alignment signal AS1 and/or the second alignment signal AS2 input from the voltage output unit 1430 may be less than a voltage swing width of the first alignment signal AS1 and/or the second alignment signal AS2 output from the second amplifier 1420. When the first alignment signal AS1 is a ground voltage or a DC voltage that is close to the ground voltage, the second amplifier 1420 might not amplify the first alignment signal AS1.

The voltage output unit 1430 receives a first control signal CS1 from the control unit 1900, generates the first alignment signal AS1 and the second alignment signal AS2 according to the first control signal CS1, and outputs the first alignment signal AS1 and the second alignment signal AS2 to the first amplifier 1410 and the second amplifier 1420, and generates a first emission timing signal LTS1 and a second emission timing signal LTS2, and outputs the first emission timing signal LTS1 and the second emission timing signal LTS2 to a first light emission driver 1731 and a second light emission driver 1732, respectively. In addition, the voltage output unit 1430 may generate a second control signal CS2 and may output the second control signal CS2 to a light emission driver 1730. The voltage output unit 1430 may be a function generator. The first alignment signal AS1 may be a DC signal, and the second alignment signal AS2, the first emission timing signal LTS1, and the second emission timing signal LTS2 may be alternating current (AC) signals. The first alignment signal AS1, the second alignment signal AS2, the second control signal CS2, the first emission timing signal LTS1, and the second emission timing signal LTS2 will be described in detail later with reference to FIGS. 10 through 13.

The voltage output unit 1430 may generate the first alignment signal AS1, the second alignment signal AS2, the first emission timing signal LTS1, and the second emission timing signal LTS2 when receiving the first control signal CS1 of the first logic level voltage. The voltage output unit 1430 might not generate the first alignment signal AS1, the second alignment signal AS2, the first emission timing signal LTS1, and the second emission timing signal LTS2 when receiving the first control signal CS1 of the second logic level voltage. Because the voltage output unit 1430 generates the first alignment signal AS1, the second alignment signal AS2, the first emission timing signal LTS1, and the second emission timing signal LTS2 together, the timing of the second alignment signal AS2 and the timing of the first emission timing signal LTS1 may be synchronized, and the timing of the second alignment signal AS2 and the timing of the second emission timing signal LTS2 may be synchronized.

The first electric-field-applying module 1500 may be located on a first side of the stage 1100. For example, the first side may be the right side. The first electric-field-applying module 1500 may include first probe heads HBD1, the first probe pins PP1, a first body portion BD1, and a first coupling portion CM1.

The first probe pins PP1 may be located on lower surfaces of the first probe heads HBD1. The first probe pins PP1 may be made of a material having high conductivity, for example, a metal material. The number of first probe pins PP1 may be the sum of the number of first alignment pads AP1 and the number of second alignment pads AP2 of the mother substrate MSUB.

The first body portion BD1 may extend in the second direction (Y-axis direction). Each of the first probe heads HBD1 may protrude from an end of a second side of the first body portion BD1 in the first direction (X-axis direction). The second side may be the left side opposite the first side. Any one of the first probe heads HBD1 may protrude from the end of the second side of the first body portion BD1 in a forward direction in the first direction (X-axis direction), whereas the other protrudes from the end of the second side of the first body portion BD1 in a reverse direction in the first direction (X-axis direction). The first body portion BD1 and the first probe heads HBD1 may be integrally formed. Alternatively, the first body portion BD1 and the first probe heads HBD1 may be separate components.

The first coupling portion CM1 may extend in the third direction (Z-axis direction). The first coupling portion CM1 may protrude from an end of a first side of the first body portion BD1 in the third direction (Z-axis direction). The first coupling portion CM1 may be located on a lower surface of the first body portion BD1. The first coupling portion CM1 may be coupled to the first body portion BD1. The first coupling portion CM1 may be coupled to the first module moving unit 1510 located on its second side. The first coupling portion CM1 may be raised or lowered by the first module moving unit 1510.

The first module moving unit 1510 may be coupled to the first side of the stage 1100. The first module moving unit 1510 may lower or raise the first electric-field-applying module 1500 according to a first module movement signal MVS1 of the control unit 1900. To this end, the first module moving unit 1510 may include a motor as a power source for moving the first electric-field-applying module 1500.

The first module moving unit 1510 may raise the first electric-field-applying module 1500 by a preset height when receiving the first module movement signal MVS1 of the first logic level voltage from the control unit 1900. The first module moving unit 1510 may lower the first electric-field-applying module 1500 by a preset height when receiving the first module movement signal MVS1 of the second logic level voltage from the control unit 1900.

When the first module moving unit 1510 descends, the first probe pins PP1 may contact the first alignment pads AP1 and the second alignment pads AP2 connected to a first display panel cell CEL1 of the mother substrate MSUB. In this case, the first alignment signal AS1 and the second alignment signal AS2 may be transmitted to the first display panel cell CEL1 of the mother substrate MSUB through the first probe pins PP1. Accordingly, light emitting elements 172 of subpixels PX1 through PX3 of the first display panel cell CEL1 may be aligned. When the first module moving unit 1510 ascends, the first probe pins PP1 may be spaced apart from the first alignment pads AP1 and the second alignment pads AP2 of the mother substrate MSUB.

The second electric-field-applying module 1600 may be located on a second side (e.g., the left side) of the stage 1100. The second side of the stage 1100 may be opposite the first side. The first electric-field-applying module 1500 and the second electric-field-applying module 1600 may be located to face each other.

The second electric-field-applying module 1600 may include second probe heads HBD2, the second probe pins PP2, a second body portion BD2, and a second coupling portion CM2.

The second probe pins PP2 may be located on lower surfaces of the second probe heads HBD2. The second probe pins PP2 may be made of a material having high conductivity, for example, a metal material. The number of second probe pins PP2 may be the sum of the number of third alignment pads AP3 and the number of fourth alignment pads AP4 of the mother substrate MSUB.

The second body portion BD2 may extend in the second direction (Y-axis direction). Each of the second probe heads HBD2 may protrude from an end of a first side of the second body portion BD2 in the first direction (X-axis direction). Any one of the second probe heads HBD2 may protrude from the end of the first side of the second body portion BD2 in the forward direction in the first direction (X-axis direction), whereas the other protrudes from the end of the first side of the second body portion BD2 in the reverse direction in the first direction (X-axis direction). The second body portion BD2 and the second probe heads HBD2 may be integrally formed. Alternatively, the second body portion BD2 and the second probe heads HBD2 may be separate components.

The second coupling portion CM2 may extend in the third direction (Z-axis direction). The second coupling portion CM2 may protrude from an end of a second side of the second body portion BD2 in the third direction (Z-axis direction). The second coupling portion CM2 may be located on a lower surface of the second body portion BD2. The second coupling portion CM2 may be coupled to the second body portion BD2. The second coupling portion CM2 may be coupled to the second module moving unit 1520 located on its first side. The second coupling portion CM2 may be raised or lowered by the second module moving unit 1520.

The second module moving unit 1520 may be coupled to the second side of the stage 1100. The second module moving unit 1520 may lower or raise the second electric-field-applying module 1600 under the control of the control unit 1900. To this end, the second module moving unit 1520 may include a motor as a power source for moving the second electric-field-applying module 1600.

The second module moving unit 1520 may raise the second electric-field-applying module 1600 by a preset height when receiving a second module movement signal MVS2 of the first logic level voltage from the control unit 1900. The second module moving unit 1520 may lower the second electric-field-applying module 1600 by a preset height when receiving the second module movement signal MVS2 of the second logic level voltage from the control unit 1900.

When the second module moving unit 1520 descends, the second probe pins PP2 may contact the third alignment pads AP3 and the fourth alignment pads AP4 connected to a second display panel cell CEL2 of the mother substrate MSUB. In this case, the first alignment signal AS1 and the second alignment signal AS2 may be transmitted to the second display panel cell CEL2 of the mother substrate MSUB through the second probe pins PP2. Accordingly, light emitting elements of subpixels PX1 through PX3 of the second display panel cell CEL2 may be aligned. When the second module moving unit 1520 ascends, the second probe pins PP2 may be spaced apart from the third alignment pads AP3 and the fourth alignment pads AP4 of the mother substrate MSUB.

The light-irradiating module 1700 may be located above the upper surface of the stage 1100. The light-irradiating module 1700 irradiates light toward the upper surface of the stage 1100. The light-irradiating module 1700 may be placed to cover the entire upper surface of the stage 1100 or the entire upper surface of the mother substrate MSUB. For example, the area of the light-irradiating module 1700 may be larger than the area of the stage 1100 or the area of the mother substrate MSUB. Alternatively, lengths of the light-irradiating module 1700 in the first direction (X-axis direction) and the second direction (Y-axis direction) may be respectively greater than lengths of the stage 1100 in the first direction (X-axis direction) and the second direction (Y-axis direction). Alternatively, the lengths of the light-irradiating module 1700 in the first direction (X-axis direction) and the second direction (Y-axis direction) may be respectively greater than lengths of the mother substrate MSUB in the first direction (X-axis direction) and the second direction (Y-axis direction).

The light-irradiating module 1700 may include a plurality of light emitting diodes. For example, when the mother substrate MSUB has a size of about 2200 mm×2500 mm, the light-irradiating module 1700 may include about 50,000 light emitting diodes.

The light-irradiating module 1700 may include a first light-irradiating module 1710 and a second light-irradiating module 1720.

The first light-irradiating module 1710 may be located above a first area adjacent to the first side of the stage 1100. The first light-irradiating module 1710 may irradiate light to the first area of the stage 1100. In addition, when the mother substrate MSUB is located on the stage 1100, the first light-irradiating module 1710 may be located above the first display panel cell CEL1. Therefore, the first light-irradiating module 1710 may irradiate light to the first display panel cell CEL1.

The second light-irradiating module 1720 may be located above a second area adjacent to the second side of the stage 1100. The second light-irradiating module 1720 may irradiate light to the second area of the stage 1100. In addition, when the mother substrate MSUB is located on the stage 1100, the second light-irradiating module 1720 may be located above the second display panel cell CEL2. Therefore, the second light-irradiating module 1720 may irradiate light to the second display panel cell CEL2.

Alternatively, the first light-irradiating module 1710 and the second light-irradiating module 1720 may be integrally formed. In this case, the first light-irradiating module 1710 and the second light-irradiating module 1720 formed integrally may simultaneously irradiate light to all the display panel cells CEL1 and CEL2 of the mother substrate MSUB. In addition, the first light-irradiating module 1710 and the second light-irradiating module 1720 formed integrally may irradiate light only to the first display panel cell CEL1 by driving light emitting diodes corresponding only to the first display panel cell CEL1. In addition, the first light-irradiating module 1710 and the second light-irradiating module 1720 formed integrally may irradiate light only to the second display panel cell CEL2 by driving light emitting diodes corresponding only to the second display panel cell CEL2.

The light-irradiating module 1700 may emit ultraviolet light or blue light. For example, the light-irradiating module 1700 may emit light having a wavelength of about 405 nm.

An active layer 172c of each light emitting element 172 may be stimulated or excited by ultraviolet light or blue light. In this case, because a first semiconductor layer 172a of each light emitting element 172 is an n-type semiconductor and a second semiconductor layer 172b is a p-type semiconductor, holes of the second semiconductor layer 172b doped with a p type rich in holes may move to the n-type doped first semiconductor layer 172a, and electrons of the first semiconductor layer 172a doped with an n type rich in electrons may move to the p-type doped second semiconductor layer 172b. Therefore, a permanent dipole moment may be strongly generated in a direction from the p-type doped second semiconductor layer 172b toward the n-type doped first semiconductor layer 172a. That is, the light emitting elements 172 may be defined as particles having polarity in the longitudinal direction when stimulated or excited by ultraviolet light or blue light of the light-irradiating module 1700.

The light emission driver 1730 may include the first light emission driver 1731 and the second light emission driver 1732.

The first light emission driver 1731 may generate a first emission driving signal LDS1 applied as a constant current. The first light emission driver 1731 may transmit the first emission driving signal LDS1 to light emitting diode arrays of the first light-irradiating module 1710 according to the first emission timing signal LTS1. Therefore, the light emitting diode arrays of the first light-irradiating module 1710 may emit light with a duty ratio (e.g., a predetermined duty ratio). The first emission timing signal LTS1 may be a signal for setting the light irradiation timing of the first light-irradiating module 1710.

The second light emission driver 1732 may generate a second emission driving signal LDS2 applied as a constant current. The second light emission driver 1732 may transmit the second emission driving signal LDS2 to light emitting diode arrays of the second light-irradiating module 1720 according to the second emission timing signal LTS2. Therefore, the light emitting diode arrays of the second light-irradiating module 1720 may emit light with a duty ratio (e.g., a predetermined duty ratio). The second emission timing signal LTS2 may be a signal for setting the light irradiation timing of the second light-irradiating module 1720.

The control unit 1900 may control operations of all components of the apparatus 1000 for manufacturing a display device. The control unit 1900 may be electrically connected to the stage moving unit 1200, the voltage output unit 1430, the first module moving unit 1510, the second module moving unit 1520, the first light emission driver 1731, and the second light emission driver 1732.

The control unit 1900 may output the stage control signal SCS to the stage moving unit 1200 to control the stage moving unit 1200. The stage moving unit 1200 may raise or lower the stage 1100 according to the stage control signal SCS.

The control unit 1900 may output the first control signal CS1 to the voltage output unit 1430 to control the voltage output unit 1430. The voltage output unit 1430 may or may not output the first alignment signal AS1, the second alignment signal AS2, the first emission timing signal LTS1, and the second emission timing signal LTS2 according to the first control signal CS1.

The control unit 1900 may output the first module movement signal MVS1 to the first module moving unit 1510 to control the first module moving unit 1510. The first module moving unit 1510 may raise or lower the first electric-field-applying module 1500 according to the first module movement signal MVS1.

The control unit 1900 may output the second module movement signal MVS2 to the second module moving unit 1520 to control the second module moving unit 1520. The second module moving unit 1520 may raise or lower the second electric-field-applying module 1600 according to the second module movement signal MVS2.

As described above, the apparatus 1000 for manufacturing a display device according to some embodiments irradiates ultraviolet light or blue light to the display panel cells CEL1 and CEL2 of the mother substrate MSUB through the light-irradiating module 1700, and transmits the first alignment signal AS1 and the second alignment signal AS2 to first and second alignment lines AL1 and AL2 of the display panel cells CEL1 and CEL2 through the first electric-field-applying module 1500 and the second electric-field-applying module 1600. In this case, the active layers 172c of the light emitting elements 172 of the display panel cells CEL1 and CEL2 may be stimulated or excited by the ultraviolet light or the blue light of the light-irradiating module 1700. Accordingly, a permanent dipole moment may be strongly generated in the direction from the p-type doped second semiconductor layers 172b toward the n-type doped first semiconductor layers 172a. Therefore, because a dielectrophoretic force can be applied to the light emitting elements 172 by an electric field, the light emitting elements 172 may be aligned such that the second semiconductor layers 172b are located toward the first alignment line AL1. That is, the light emitting elements 172 may be deflected. Thus, the alignment accuracy of the light emitting elements 172 can be increased.

Figure 10:
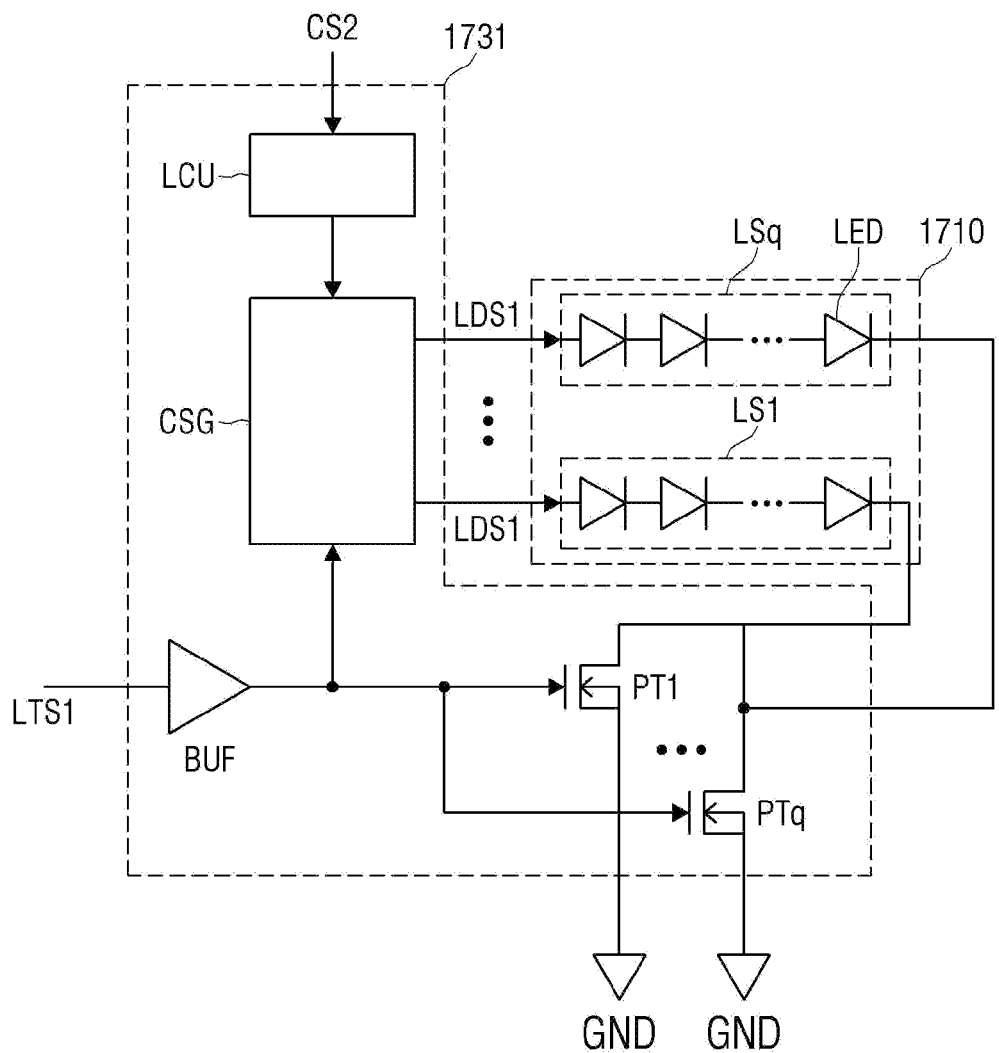
FIG. 10 illustrates an example of a first light emission driver of FIG. 9 in detail.

FIG. 10 illustrates an example of the first light emission driver 1731 of FIG. 9 in detail.

Referring to FIG. 10, the first light emission driver 1731 includes an emission control unit LCU, a constant current generating circuit CSG, a buffer unit BUF, and first through $q^{th}$ emission control transistors PT1 through PTq (where q is an integer of 2 or more). The first light-irradiating module 1710 may include first through $q^{th}$ light emitting diode arrays LS1 through LSq, and each of the first through $q^{th}$ light emitting diode arrays LS1 through LSq may include light emitting diodes LED.

The emission control unit LCU may receive the second control signal CS2 from the control unit 1900. The emission control unit LCU may supply emission control data, which is digital data, and driving voltages or control signals, which are analog signals, to the constant current generating circuit CSG according to the second control signal CS2.

The buffer unit BUF may amplify the first emission timing signal LTS1 and supply the amplified first emission timing signal LTS1 to the constant current generating circuit CSG and gate electrodes of the first through $q^{th}$ emission control transistors PT1 through PTq. The buffer unit BUF may include an operational amplifier.

The constant current generating circuit CSG may receive the amplified first emission timing signal LTS1 from the buffer unit BUF. The constant current generating circuit CSG may receive the emission control data, which is digital data, and the driving voltages or the control signals, which are analog signals, from the emission control unit LCU. The constant current generating circuit CSG may generate the first emission driving signal LDS1 according to the first emission timing signal LTS1, the emission control data, the driving voltages or the control signals. The constant current generating circuit CSG may supply the first emission driving signal LDS1 to an end of each of the first through $q^{th}$ light emitting diode arrays LS1 through LSq. The first emission driving signal LDS1 may be a constant current signal, and the end of each of the light emitting diode arrays LS1 through LSq may be an anode of a light emitting diode LED located at the top of each of the first through $q^{th}$ light emitting diode arrays LS1 through LSq.

The constant current generating circuit CSG may include a buck power unit and a boost power unit. The buck power unit may lower a current value of the first emission driving signal LDS1. The boost power unit may increase the current value of the first emission driving signal LDS1.

The first through $q^{th}$ emission control transistors PT1 through PTq may be connected one-to-one to the first through $q^{th}$ light emitting diode arrays LS1 through LSq. Each of the first through $q^{th}$ emission control transistors PT1 through PTq may be located between the other end of any one of the first through $q^{th}$ light emitting diode arrays LS1 through LSq and a ground voltage source GND. The other end of any one of the first through $q^{th}$ light emitting diode arrays LS1 through LSq may be a cathode of a light emitting diode LED located at the bottom of each of the first through $q^{th}$ light emitting diode arrays LS1 through LSq. Each of the first through $q^{th}$ emission control transistors PT1 through PTq connects any one of the first through $q^{th}$ light emitting diode arrays LS1 through LSq to the ground voltage source GND according to the first emission timing signal LTS1.

When each of the first through $q^{th}$ emission control transistors PT1 through PTq is turned on by the first emission timing signal LTS1, any one of the first through CP light emitting diode arrays LS1 through LSq may be connected to the ground voltage source GND. In this case, the first through $q^{th}$ light emitting diode arrays LS1 through LSq may emit light.

When each of the first through $q^{th}$ emission control transistors PT1 through PTq is turned off by the first emission timing signal LTS1, any one of the first through CP light emitting diode arrays LS1 through LSq might not be connected to the ground voltage source GND. In this case, the first through $q^{th}$ light emitting diode arrays LS1 through LSq might not emit light.

Each of the first through $q^{th}$ emission control transistors PT1 through PTq may be an N-channel field effect transistor. Each of the first through $q^{th}$ emission control transistors PT1 through PTq may include the gate electrode to which the first emission timing signal LTS1 is input, a source electrode connected to any one of the first through $q^{th}$ light emitting diode arrays LS1 through LSq, and a drain electrode connected to the ground voltage source GND. In this case, each of the first through CP emission control transistors PT1 through PTq may be turned on when the first emission timing signal LTS1 of a second high level voltage HV2 (e.g., see FIG. 11) is input to the gate electrode.

As illustrated in FIG. 10, because each of the first through $q^{th}$ emission control transistors PT1 through PTq is turned on by the first emission timing signal LTS1, the emission timing of each of the first through $q^{th}$ light emitting diode arrays LS1 through LSq may be determined by the first emission timing signal LTS1. Therefore, the duty ratio of light irradiated by the first light-irradiating module 1710 may be determined by the first emission timing signal LTS1.

Because the second light emission driver 1732 is substantially the same as the first light emission driver 1731 described above with reference to FIG. 10, a description of the second light emission driver 1732 will be omitted.

Figure 11:
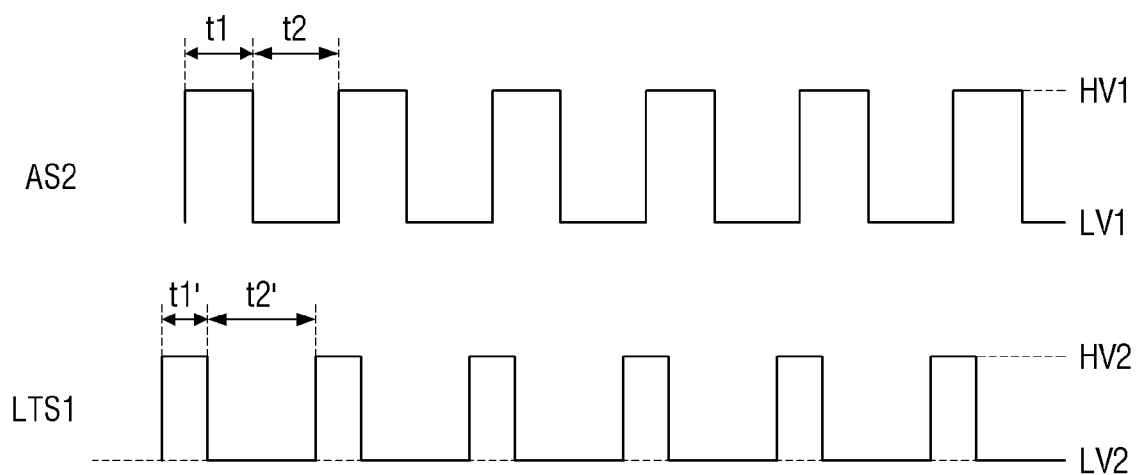
FIG. 11 is a waveform diagram illustrating an example of a second alignment signal and a first emission timing signal of FIG. 9.

FIG. 11 is a waveform diagram illustrating an example of the second alignment signal AS2 and the first emission timing signal LTS1 of FIG. 9.

Referring to FIG. 11, the second alignment signal AS2 and the first emission timing signal LTS1 may be AC signals, whereas the first alignment signal AS1 is a ground voltage or a DC signal having a level (e.g., a predetermined level).

The second alignment signal AS2 may be a square wave having a first high level voltage HV1 during a first period t1 and a first low level voltage LV1 during a second period t2. A plurality of first periods t1 and a plurality of second periods t2 may be alternately arranged.

The first emission timing signal LTS1 may be a square wave having a second high level voltage HV2 during another first period t1' and a second low level voltage LV2 during another second period t2'. A plurality of other first periods t1' and a plurality of other second periods t2' may be alternately arranged. Because the first emission timing signal LTS1 controls the turn-on or turn-off of each of the first through $q^{th}$ emission control transistors PT1 through PTq, the other first period t1' may be defined as a light irradiation period of the first light-irradiating module 1710, and the other second period t2' may be defined as a light irradiation-off period of the first light-irradiating module 1710.

For example, the duty ratio of light irradiated by the first light-irradiating module 1710 may be, but is not limited to, about 1% to 50%, for example, about 20%. The other first period t1' and the other second period t2' may be set to satisfy the above duty ratio. When the duty ratio of light irradiated by the first light-irradiating module 1710 is less than about 1%, it may be difficult for the active layer 172c of each of the light emitting elements 172 to be sufficiently stimulated or excited by ultraviolet light or blue light of the light-irradiating module 1700. In this case, it may be difficult for a permanent dipole moment to be generated in the direction from the p-type doped semiconductor layer 172b toward the n-type doped first semiconductor layer 172a, thus making it difficult to deflect the light emitting elements 172 of the mother substrate MSUB (e.g., to align the light emitting elements 172 such that the second semiconductor layers 172b are located toward the first alignment line AL1). In addition, when the duty ratio of light irradiated by the first light-irradiating module 1710 is greater than 50%, the temperature of a solution including the light emitting elements 172 of the mother substrate MSUB may be increased by the above light. In this case, the solution may reach or get near a boiling point, thus making it difficult to deflect the light emitting elements 172.

The timing of the second alignment signal AS2 and the timing of the first emission timing signal LTS1 may be substantially the same. The period of the second alignment signal AS2 and the period of the first emission timing signal LTS1 may be substantially the same. The second alignment signal AS2, the first emission timing signal LTS1, and the second emission timing signal LTS2 may have a frequency of about 50 kHz, but are not limited thereto.

The sum of the first period t1 and the second period t2 of the second alignment signal AS2 may be substantially equal to the sum of the other first period t1' and the other second period t2' of the first emission timing signal LTS1. The first period t1 of the second alignment signal AS2 may be longer than the other first period t1' of the first emission timing signal LTS1. The second period t2 of the second alignment signal AS2 may be shorter than the second period t2' of the first emission timing signal LTS1.

At a time when the second alignment signal AS2 changes from the first low level voltage LV1 to the first high level voltage HV1, the first emission timing signal LTS1 may have the second high level voltage HV2. At least a portion of the first period t1 of the second alignment signal AS2 and at least a portion of the other first period t1' of the first emission timing signal LTS1 may overlap each other. A time when the first emission timing signal LTS1 changes from the second low level voltage LV2 to the second high level voltage HV2 may be earlier than the time when the second alignment signal AS2 changes from the first low level voltage LV1 to the first high level voltage HV1. A time when the first emission timing signal LTS1 changes from the second high level voltage HV2 to the second low level voltage LV2 may be later than the time when the second alignment signal AS2 changes from the first low level voltage LV1 to the first high level voltage HV1.

The first high level voltage HV1 may be a voltage having a higher level than the first low level voltage LV1. The second high level voltage HV2 may be a voltage having a higher level than the second low level voltage LV2. The first high level voltage HV1 and the second high level voltage HV2 may be different. The first low level voltage LV1 and the second low level voltage LV2 may be different.

As illustrated in FIG. 11, the first emission timing signal LTS1 of the second high level voltage HV2 is transmitted at the time when the second alignment signal AS2 changes from the first low level voltage LV1 to the first high level voltage HV1. Therefore, the first light-irradiating module 1710 may irradiate light to the mother substrate MSUB at a time when an electric field is applied to align the light emitting elements 172. Accordingly, a permanent dipole moment may be relatively strongly generated in each of the light emitting elements 172 at the time when the electric field is applied to align the light emitting elements 172. Therefore, because a dielectrophoretic force is applied to the light emitting elements 172 by the electric field, the light emitting elements 172 may be aligned such that the second semiconductor layers 172b are located toward the first alignment line AL1. That is, the light emitting elements 172 may be deflected. Thus, the alignment accuracy of the light emitting elements 172 can be increased.

Figure 12:
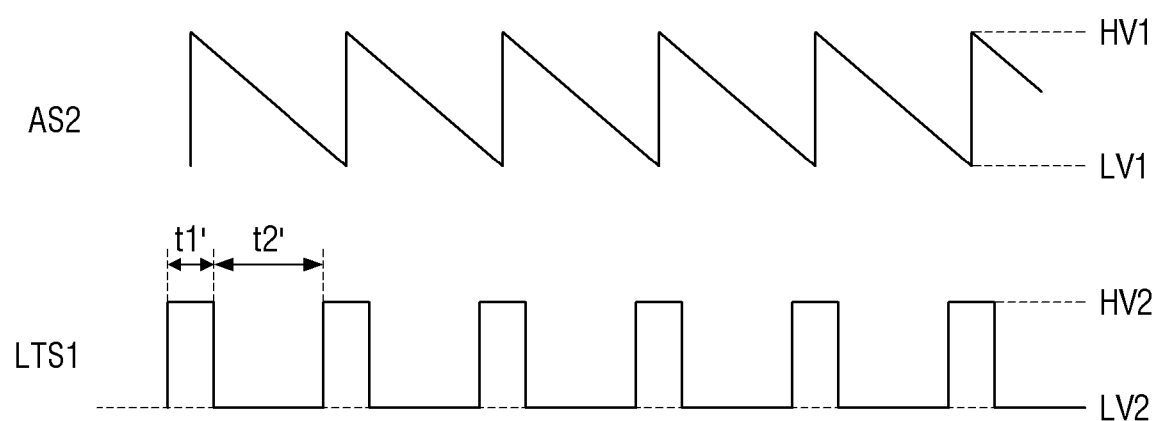
FIG. 12 is a waveform diagram illustrating an example of the second alignment signal and the first emission timing signal of FIG. 9.

FIG. 12 is a waveform diagram illustrating an example of the second alignment signal AS2 and the first emission timing signal LTS1 of FIG. 9.

The embodiments of FIG. 12 are different from FIG. 11 in that the second alignment signal AS2 is a sawtooth wave. In FIG. 12, differences from FIG. 11 will be mainly described.

Referring to FIG. 12, the second alignment signal AS2 may immediately (e.g., relatively immediately, or quickly) rise from a first low level voltage LV1 to a first high level voltage HV1, and then slowly fall from the first high level voltage HV1 to the first low level voltage LV1. Alternatively, a period during which the second alignment signal AS2 rises from the first low level voltage LV1 to the first high level voltage HV1 may be shorter than a period during which the second alignment signal AS2 falls from the first high level voltage HV1 to the first low level voltage LV1.

Another first period t1' during which the first emission timing signal LTS1 has a second high level voltage HV2 may be shorter than the period during which the second alignment signal AS2 rises from the first low level voltage LV1 to the first high level voltage HV1. Another second period t2' during which the first emission timing signal LTS1 has a second low level voltage LV2 may be shorter than the period during which the second alignment signal AS2 falls from the first high level voltage HV1 to the first low level voltage LV1.

Figure 13:
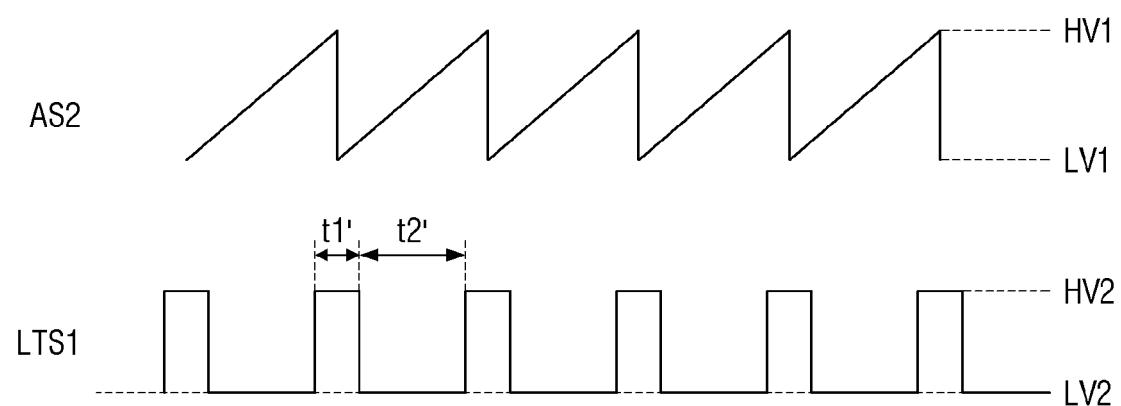
FIG. 13 is a waveform diagram illustrating an example of the second alignment signal and the first emission timing signal of FIG. 9.

FIG. 13 is a waveform diagram illustrating an example of the second alignment signal AS2 and the first emission timing signal LTS1 of FIG. 9.

The embodiments of FIG. 13 are different from FIG. 11 in that the second alignment signal AS2 is a ramp wave. In FIG. 13, differences from FIG. 11 will be mainly described.

Referring to FIG. 13, the second alignment signal AS2 may gradually rise from a first low level voltage LV1 to a first high level voltage HV1, and then immediately (e.g., relatively immediately, or quickly) fall from the first high level voltage HV1 to the first low level voltage LV1. Alternatively, a period during which the second alignment signal AS2 rises from the first low level voltage LV1 to the first high level voltage HV1 may be longer than a period during which the second alignment signal AS2 falls from the first high level voltage HV1 to the first low level voltage LV1.

Another first period t1' during which the first emission timing signal LTS1 has a second high level voltage HV2 may be shorter than the period during which the second alignment signal AS2 falls from the first high level voltage HV1 to the first low level voltage LV1. Another second period t2' during which the first emission timing signal LTS1 has a second low level voltage LV2 may be shorter than the period during which the second alignment signal AS2 rises from the first low level voltage LV1 to the first high level voltage HV1.

At a time when the second alignment signal AS2 changes from the first high level voltage HV1 to the first low level voltage LV1, the first emission timing signal LTS1 may have the second high level voltage HV2. A time when the first emission timing signal LTS1 changes from the second low level voltage LV2 to the second high level voltage HV2 may be earlier than the time when the second alignment signal AS2 changes from the first high level voltage HV1 to the first low level voltage LV1. A time when the first emission timing signal LTS1 changes from the second high level voltage HV2 to the second low level voltage LV2 may be later than the time when the second alignment signal AS2 changes from the first high level voltage HV1 to the first low level voltage LV1.

The second alignment signal AS2 is not limited to the square wave, the sawtooth wave, or the ramp wave illustrated in FIGS. 11 through 13, and may also have other waveforms in other embodiments.

In addition, because the second emission timing signal LTS2 is substantially the same as the first emission timing signal LTS1 described above with reference to FIGS. 11 through 13, a description of the second emission timing signal LTS2 will be omitted.

Figure 14:
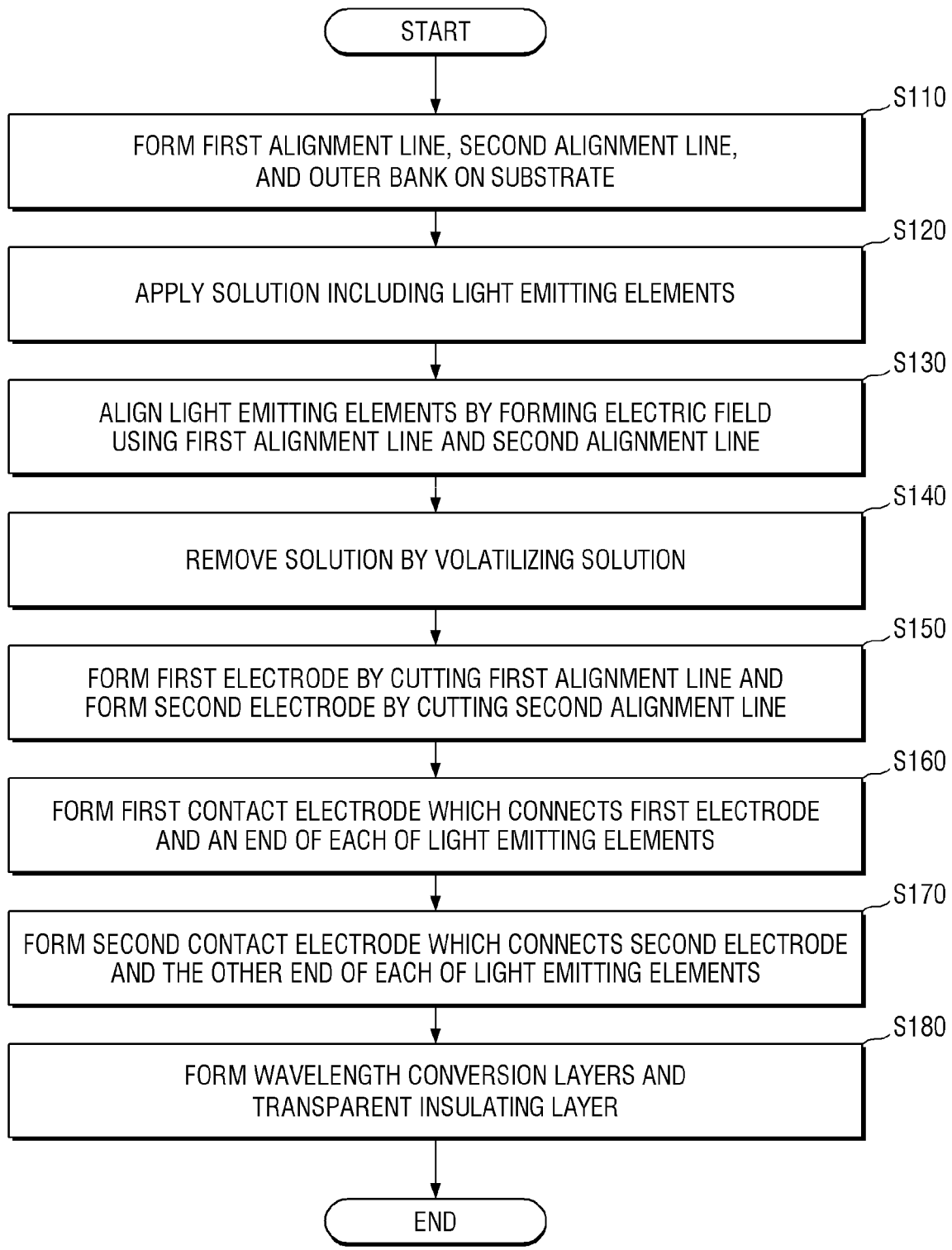
FIG. 14 is a flowchart illustrating a method of manufacturing a display device according to some embodiments.

FIG. 14 is a flowchart illustrating a method of manufacturing a display device according to some embodiments, and FIGS. 15 through 22 are cross-sectional views of the display panel taken along the line I-I' of FIG. 3 and illustrating an example of a display panel to describe the method of manufacturing a display device according to some embodiments.

Figure 15:
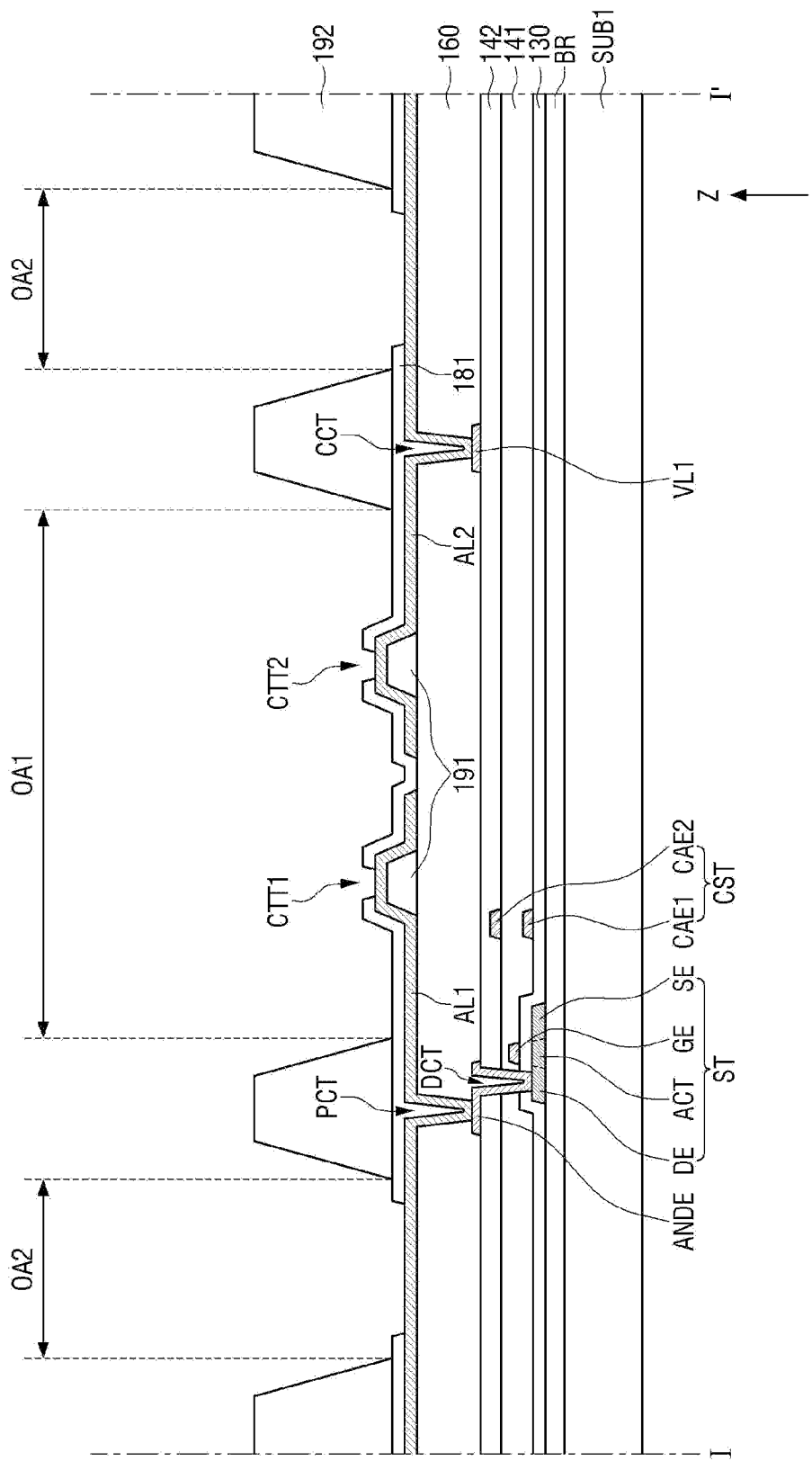
FIGS. 15 through 22 are cross-sectional views illustrating an example of a display panel to describe the method of manufacturing a display device according to some embodiments.

First, referring to FIG. 15, inner banks 191, a first alignment line AL1, and a second alignment line AL2 are formed on a substrate SUB1 (operation S110 of FIG. 14).

For example, a barrier layer BR is formed by depositing an inorganic material on the substrate SUB1.

Then, a semiconductor layer including an active layer ACT, a source electrode SE, and a drain electrode DE of a thin-film transistor ST is formed on the barrier layer BR by using a photolithography process. The semiconductor layer may be polycrystalline silicon, monocrystalline silicon, low-temperature polycrystalline silicon, amorphous silicon, or an oxide semiconductor.

Next, a gate insulating layer 130 is formed by depositing an inorganic material on the active layer ACT, the source electrode SE, and the drain electrode DE of the thin-film transistor ST.

Next, a first gate conductive layer including a gate electrode GE of the thin-film transistor ST, and a first capacitor electrode CAE1 of a capacitor CST, is formed on the gate insulating layer 130 by using a photolithography process.

Next, the source electrode SE and the drain electrode DE are doped with ions or impurities by using the gate electrode GE of the thin-film transistor ST as a mask. Accordingly, the source electrode SE and the drain electrode DE of the thin-film transistor ST may have conductivity.

Next, a first interlayer insulating film 141 is formed by depositing an inorganic material on the gate electrode GE of the thin-film transistor ST and the first capacitor electrode CAE1.

Next, a second gate conductive layer including a second capacitor electrode CAE2 of the capacitor CST is formed on the first interlayer insulating film 141 by using a photolithography process.

Next, a second interlayer insulating film 142 is formed by depositing an inorganic material on the second capacitor electrode CAE2.

Next, a drain contact hole DCT is formed using a photolithography process to penetrate the gate insulating layer 130, the first interlayer insulating film 141, and the second interlayer insulating film 142, and to expose the drain electrode DE of the thin-film transistor ST.

Next, a data conductive layer including a connection electrode ANDE and a first power line VL1 is formed on the second interlayer insulating film 142 by using a photolithography process. The connection electrode ANDE may be connected to the drain electrode DE of the thin-film transistor ST through the drain contact hole DCT.

Next, a planarization layer 160 is formed by depositing an organic material on the connection electrode ANDE.

Next, the inner banks 191 are formed by depositing an organic material.

Next, a pixel contact hole PCT, which penetrates the planarization layer 160 to expose the connection electrode ANDE, and a common contact hole CCT, which penetrates the planarization layer 160 to expose the first power line VL1, are substantially simultaneously or concurrently formed using a photolithography process.

Next, the first alignment line AL1 and the second alignment line AL2 are formed on the planarization layer 160 by using a photolithography process. The first alignment line AL1 may be connected to the connection electrode ANDE through the pixel contact hole PCT. The second alignment line AL2 may be connected to the first power line VL1 through the common contact hole CCT.

Next, a first insulating layer 181 is formed by depositing an inorganic material on a first electrode 171 and a second electrode 173.

Next, an outer bank 192 is formed by depositing an organic material on the first insulating layer 181.

Next, a portion of the first insulating layer 181 is removed using a photolithography process to expose the first alignment line AU and the second alignment line AL2 in a second opening OA2.

Figure 16:
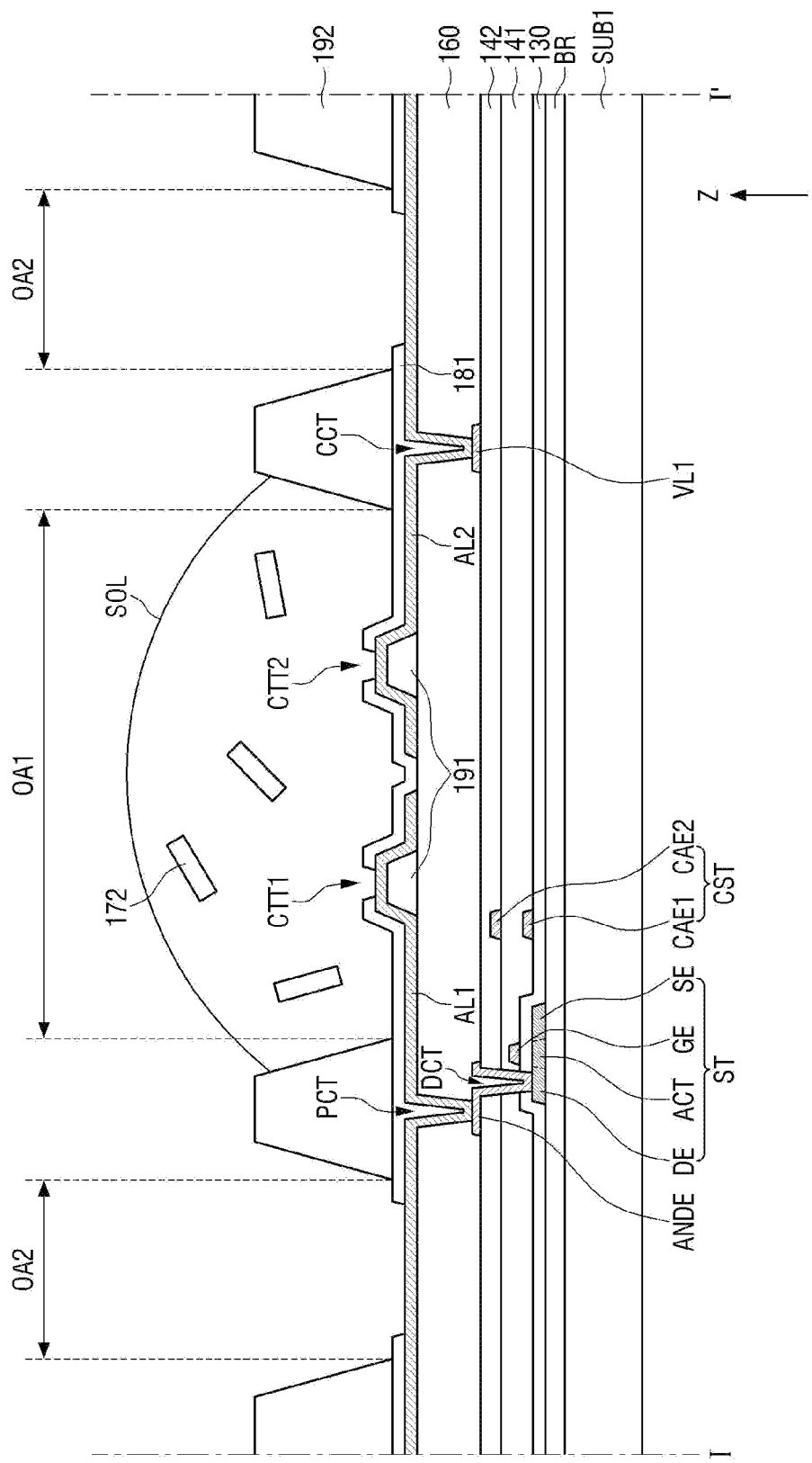

Second, referring to FIG. 16, a solution SOL including light emitting elements 172 is applied onto the first alignment line AL1 and the second alignment line AL2 (operation S120 of FIG. 14).

The light emitting elements 172 may be dispersed disorderly and randomly within the solution SOL. The solution SOL may be applied using various processes such as inkjet printing, inkjet injection, slot dye coating, and slot dye printing.

Figure 17:
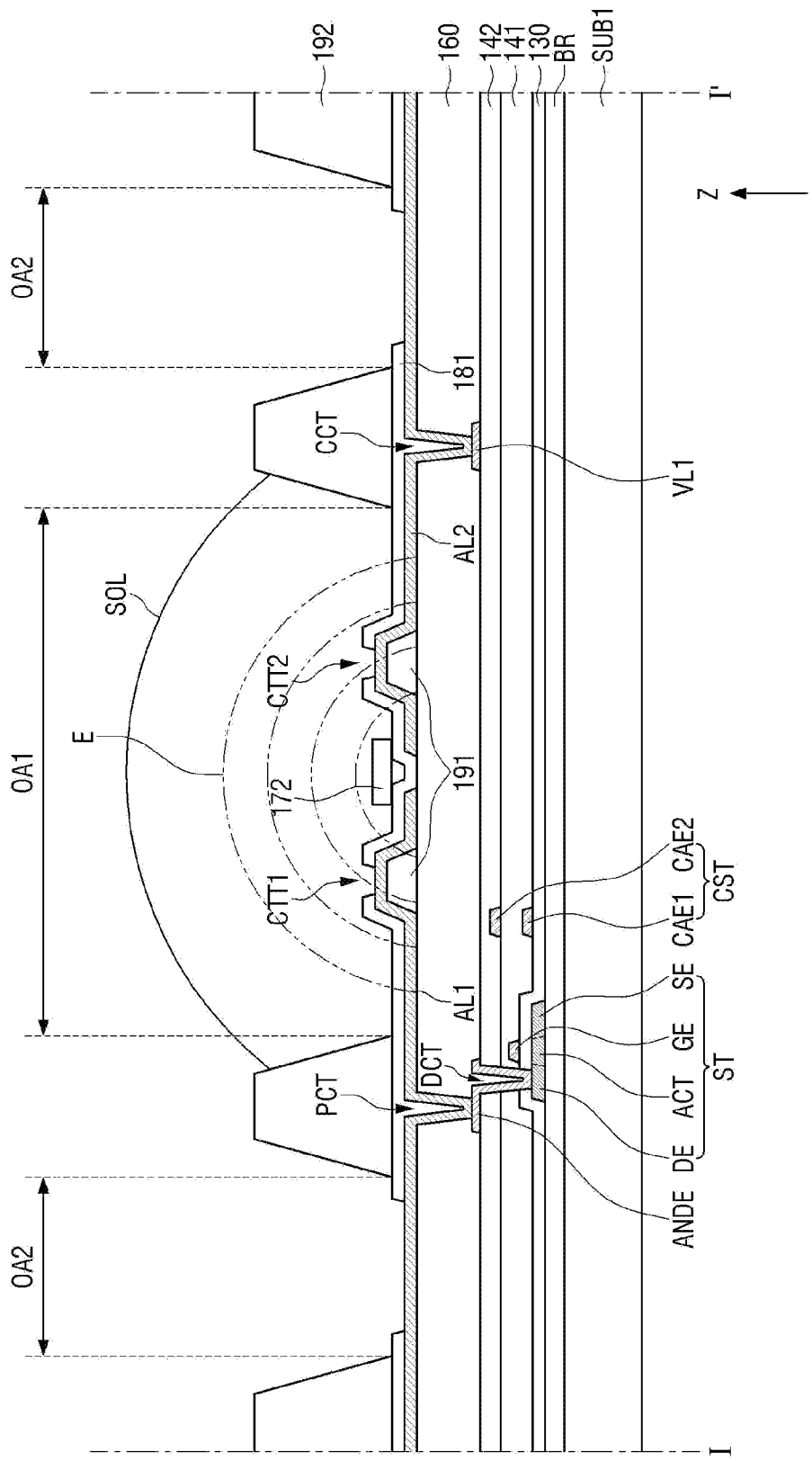

Third, referring to FIG. 17, the light emitting elements 172 are aligned by forming an electric field E between the first alignment line AL1 and the second alignment line AL2 (operation S130 of FIG. 14).

For example, the first alignment line AL1 may receive a first alignment voltage through first alignment pads AP1, and the second alignment line AL2 may receive a second alignment voltage through second alignment pads AP2. The first alignment voltage may be a ground voltage or a DC signal having a level (e.g., a predetermined level), and the second alignment voltage may be an AC signal. Therefore, the electric field E may be formed between the first alignment line AU and the second alignment line AL2. In this case, the light emitting elements 172 may be aligned between the first alignment line AL1 and the second alignment line AL2 by receiving a dielectrophoretic force due to the electric field E. Here, a first emission driving signal LDS1 is transmitted to a first light-irradiating module 1710, and a second emission driving signal LDS2 is transmitted to the second light-irradiating module 1720. Accordingly, light is irradiated to a mother substrate MSUB.

That is, the first light-irradiating module 1710 and the second light-irradiating module 1720 may irradiate light to the mother substrate MSUB at a time when an electric field is applied to align the light emitting elements 172. Accordingly, a permanent dipole moment may be strongly generated in each of the light emitting elements 172 at the time when the electric field is applied to align the light emitting elements 172. Therefore, because a dielectrophoretic force is applied to the light emitting elements 172 by the electric field, the light emitting elements 172 may be aligned such that second semiconductor layers 172*b* are located toward the first alignment line AL1. That is, the light emitting elements 172 may be deflected. Thus, the alignment accuracy of the light emitting elements 172 can be increased.

Operation S130 of FIG. 14 will be described in detail with reference to FIGS. 23 through 28.

Figure 18:
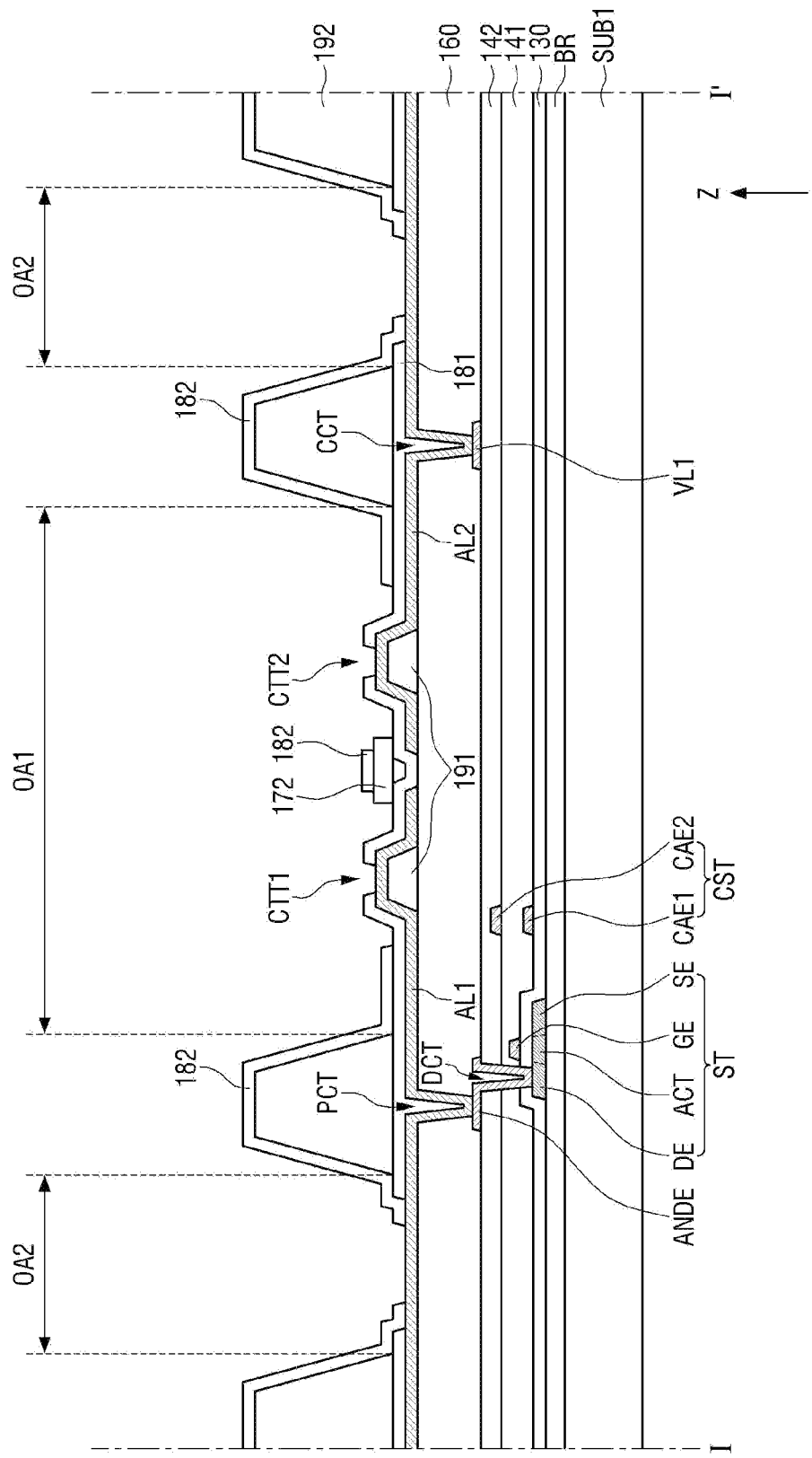

Fourth, referring to FIG. 18, after the light emitting elements 172 are aligned between the first electrode 171 and the second electrode 173, the applied solution S is removed by volatilization (operation S140 of FIG. 14).

After the light emitting elements 172 are aligned by forming the electric field E between the first alignment line AL1 and the second alignment line AL2 adjacent to each other, the solution SOL may be dried. When the solution SOL is dried, if the solution SOL is not uniformly volatilized, but is instead volatilized first in a certain area, a hydrodynamic force may be generated in the solution SOL. In this case, the positions of the light emitting elements 172 may be moved by the hydrodynamic force. Therefore, the process of drying the solution SOL may be performed in a state where the alignment of the light emitting elements 172 is maintained.

Next, a second insulating layer 182 may be formed by depositing an inorganic material on the first insulating layer 181 and the light emitting elements 172. The light emitting elements 172 may be fixed by the second insulating layer 182.

Next, a portion of the second insulating layer 182 is removed using a photolithography process to expose first ends and second ends of the light emitting elements 172 in a first opening OA1 and to expose the first alignment line AL1 and the second alignment line AL2 in the second opening OA2.

Figure 19:
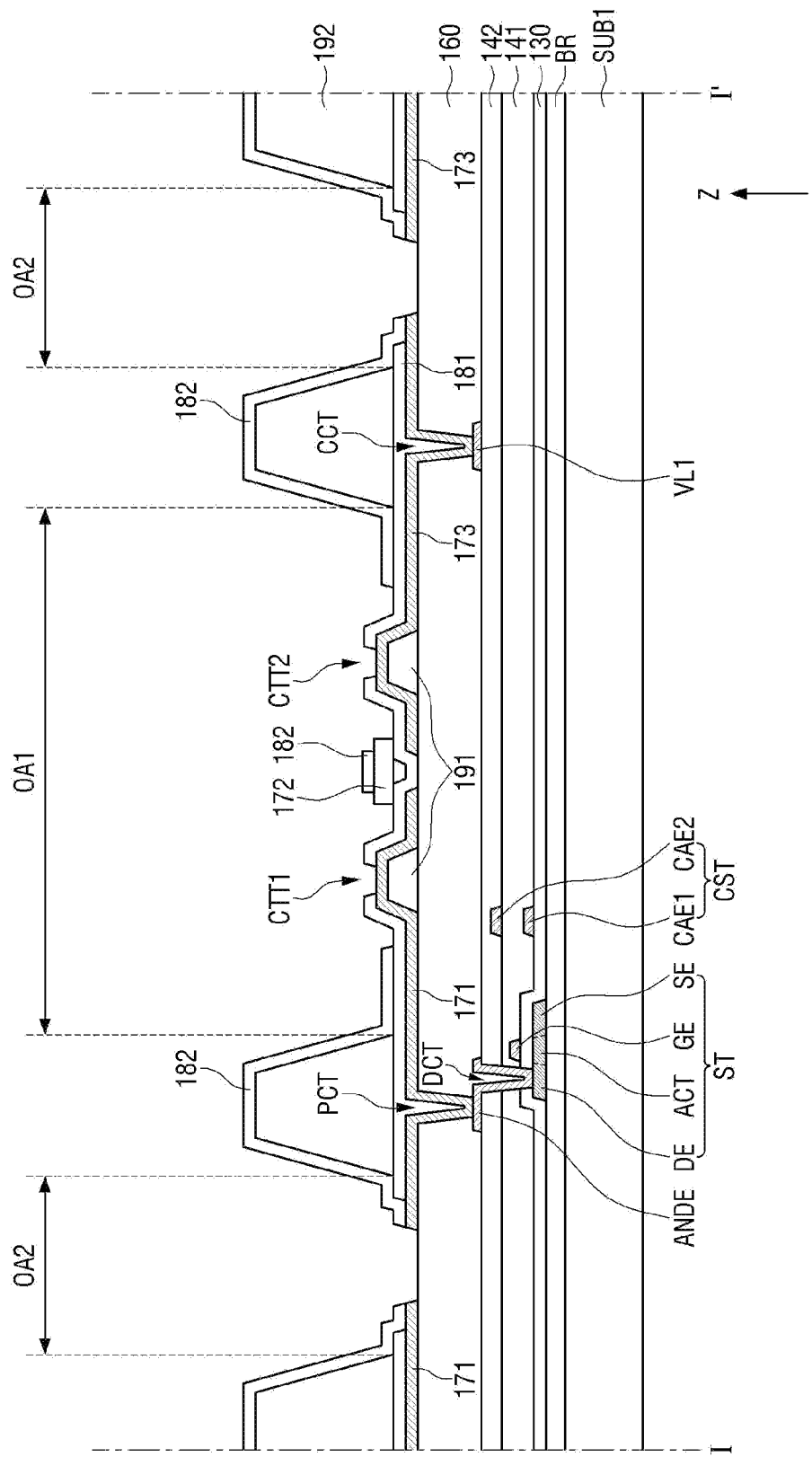

Fifth, referring to FIG. 19, the first electrode 171 is formed by cutting the first alignment line AL1, and the second electrode 173 is formed by cutting the second alignment line AL2 (operation S150 of FIG. 14).

The first alignment line AL1 and the second alignment line AL2 exposed in the second opening OA2 are etched using the second insulating layer 182 as a mask, thereby cutting the first alignment line AL1 and the second alignment line AL2.

Figure 20:
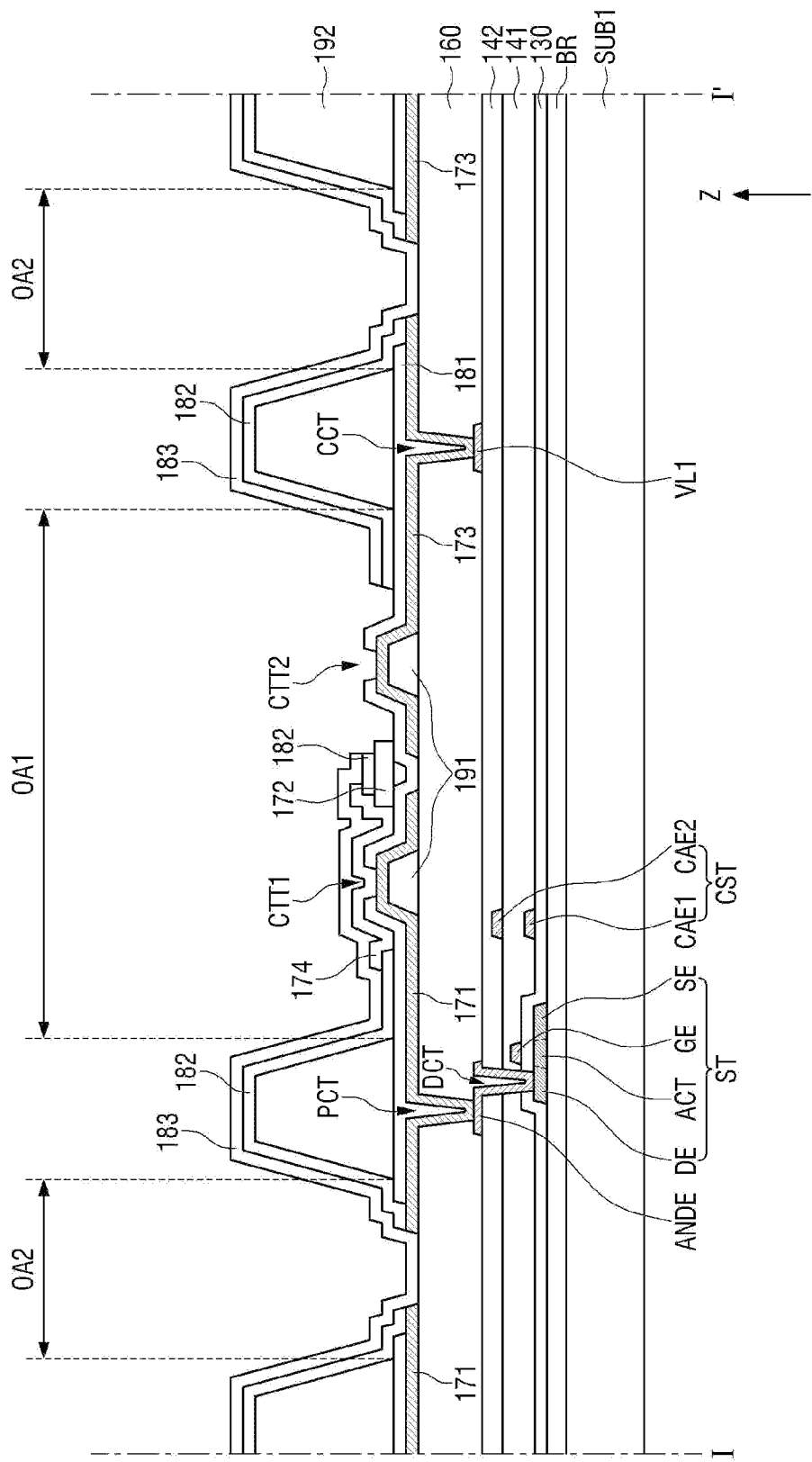

Sixth, referring to FIG. 20, a first contact electrode 174 contacting the first ends of the light emitting elements 172 is formed (operation S160 of FIG. 14).

For example, a first contact hole CTT1 penetrating the first insulating layer 181 to expose the first electrode 171, and a second contact hole CTT2 penetrating the first insulating layer 181 to expose the second electrode 173, are substantially simultaneously or concurrently formed using a photolithography process.

Next, the first contact electrode 174 is formed on the first insulating layer 181 by using a photolithography process. The first contact electrode 174 may be connected to the first electrode 171 through the first contact hole CTT1.

Next, a third insulating layer 183 is formed by depositing an inorganic material on the first contact electrode 174.

Figure 21:
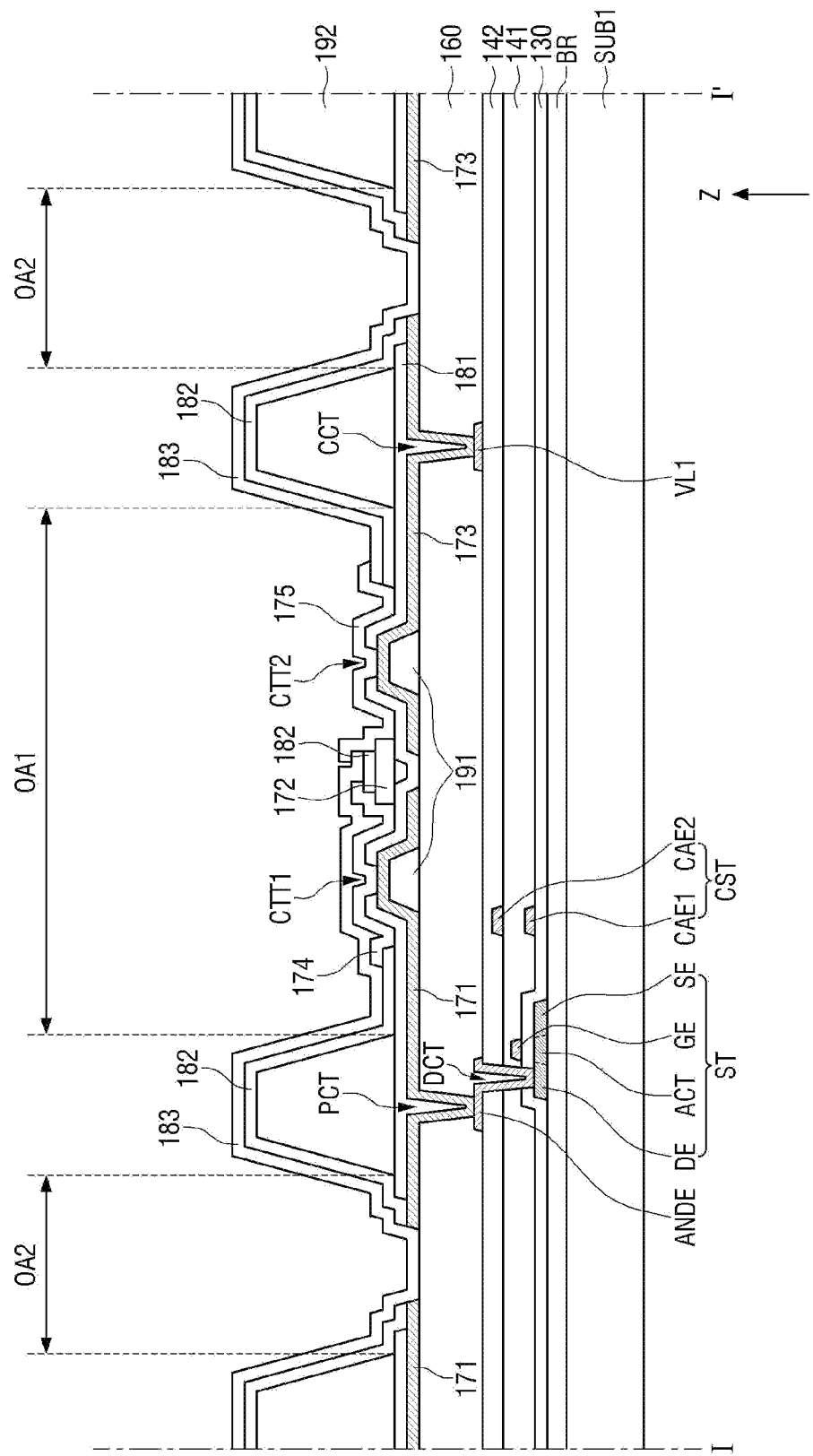

Seventh, referring to FIG. 21, a second contact electrode 175 contacting the second ends of the light emitting elements 172 is formed (operation S170 of FIG. 14).

The second contact electrode 175 is formed on the first insulating layer 181 by using a photolithography process. The second contact electrode 175 may be connected to the second electrode 173 through the second contact hole CTT2.

Figure 22:
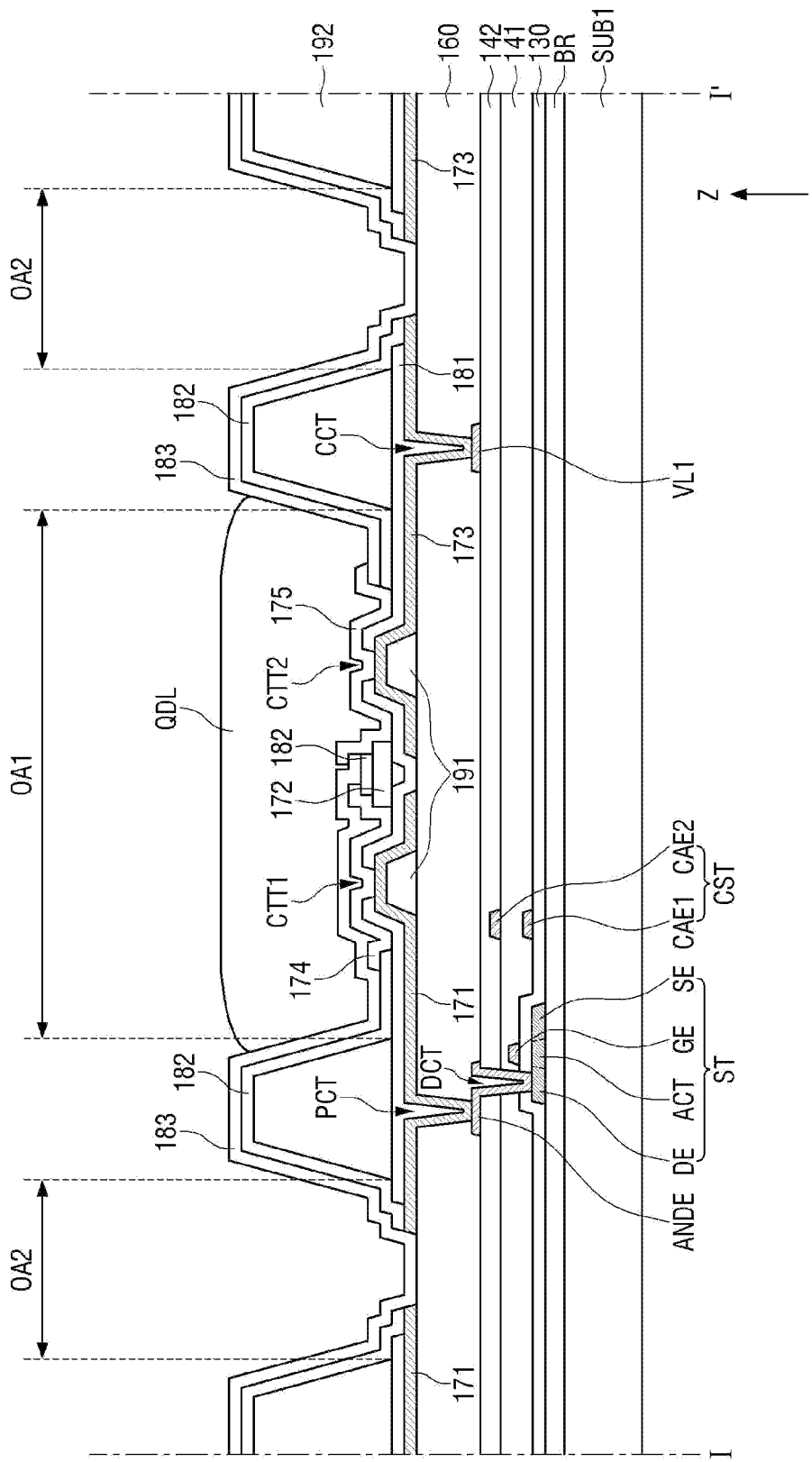

Eighth, referring to FIG. 22, a first wavelength conversion layer QDL, a second wavelength conversion layer, or a transparent insulating layer is formed on the light emitting elements 172 (operation S180 of FIG. 14).

The first wavelength conversion layer QDL may be located in a first subpixel PX1, the second wavelength conversion layer may be located in a second subpixel PX2, and the transparent insulating layer may be located in a third subpixel PX3.

Figure 23:
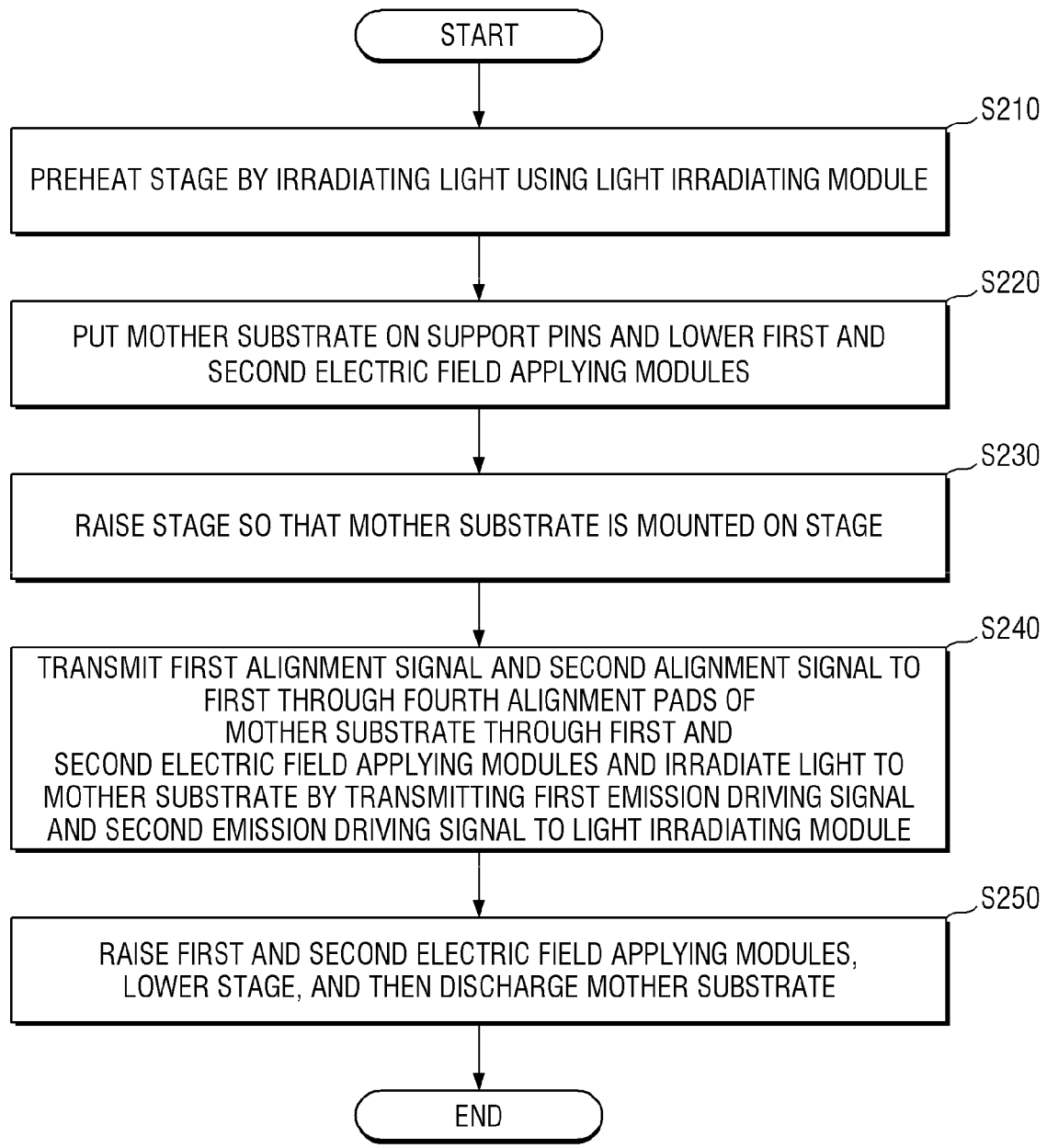
FIG. 23 is a flowchart illustrating a method of aligning light emitting elements according to some embodiments.

FIG. 23 is a flowchart illustrating a method of aligning light emitting elements according to some embodiments, and FIGS. 24 through 28 are side views of an apparatus for manufacturing a display device for describing the method of manufacturing a display device according to some embodiments. The method of aligning the light emitting elements 172 in operation S130 of FIG. 14 will now be described in detail with reference to FIGS. 23 through 28.

Figure 24:
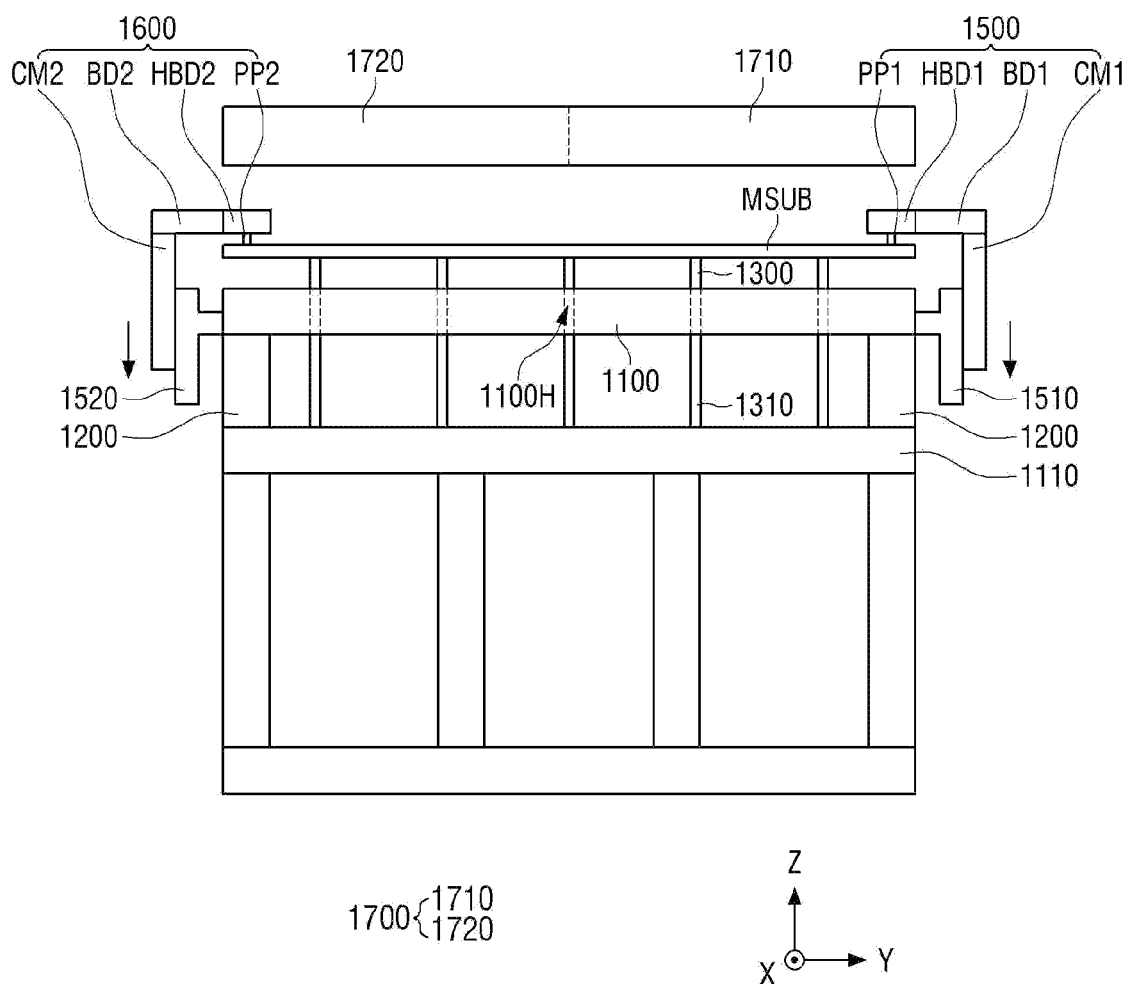
FIGS. 24 through 28 are side views of an apparatus for manufacturing a display device for describing the method of manufacturing a display device according to some embodiments.

First, referring to FIG. 24, a light-irradiating module 1700 preheats a stage 1100 by irradiating light L. The light-irradiating module 1700 may irradiate the light L until the temperature of the stage 1100 rises to between 50 and 70 degrees Celsius (operation S210 of FIG. 23).

When the temperature of the stage 1100 is lower than 50 degrees Celsius, the viscosity of the solution SOL may increase, thereby reducing the fluidity of the light emitting elements 172. In addition, when the temperature of the stage 1100 is higher than 70 degrees Celsius, the solution SOL may reach or approach a boiling point. Therefore, the temperature of the stage 1100 may be preheated to between 50 and 70 degrees Celsius.

Because a second alignment signal AS2 is not transmitted in the preheating of the stage 110, each of the first emission driving signal LDS1 and the second emission driving signal LDS2 does not need to be synchronized with the second alignment signal AS2. In this case, a control unit 1900 may generate a third emission driving signal by itself, and may transmit the third emission driving signal to a first light emission driver 1731 and to a second light emission driver 1732. In this case, the duty ratio of light irradiated by the first light-irradiating module 1710 and by the second light-irradiating module 1720 of the light-irradiating module 1700 may be determined by the third emission driving signal.

For the rapid temperature rise of the stage 1100, it is desirable for the duty ratio of light irradiated by the first light-irradiating module 1710 and by the second light-irradiating module 1720 of the light-irradiating module 1700 to be high. Therefore, a period during which the third emission driving signal has a second high level voltage HV2 may be longer than a period during which the first emission driving signal LDS1 has the second high level voltage HV2 and a period during which the second emission driving signal LDS2 has the second high level voltage HV2.

Figure 25:
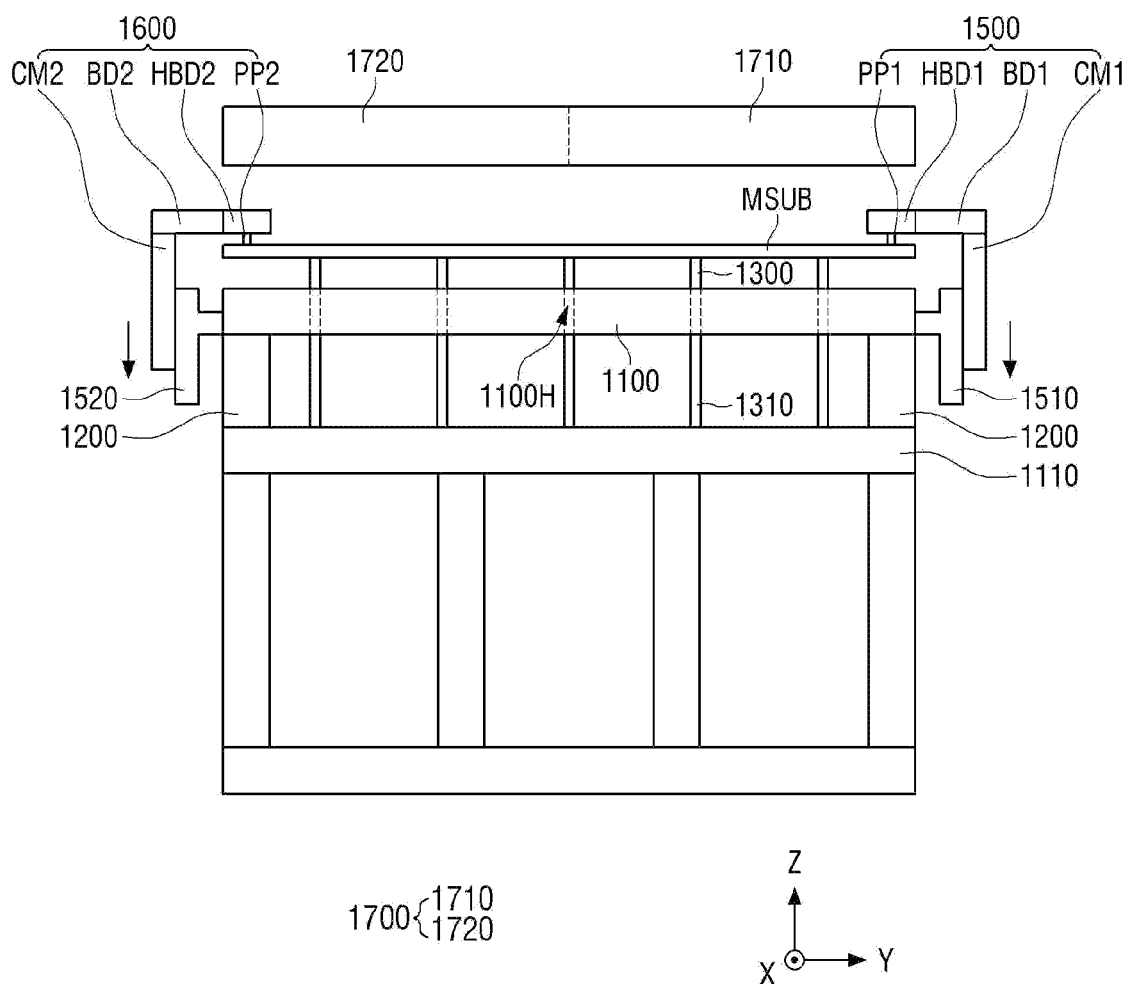

Next, referring to FIG. 25, the mother substrate MSUB is put on support pins 1300, and a first electric-field-applying module 1500 and a second electric-field-applying module 1600 are lowered (operation S220 of FIG. 23).

The mother substrate MSUB may be put on the support pins 1300 by using a robot or the like. When the mother substrate MSUB is put on the support pins 1300, the control unit 1900 outputs a first module movement signal MVS1 of a second logic level voltage to a first module moving unit 1510, and outputs a second module movement signal MVS2 of the second logic level voltage to a second module moving unit 1520. The first module moving unit 1510 lowers the first electric-field-applying module 1500 (e.g., by a preset height) according to the first module movement signal MVS1 of the second logic level voltage, and the second module moving unit 1520 lowers the second electric-field-applying module 1600 (e.g., by a preset height) according to the second module movement signal MVS2 of the second logic level voltage.

When the first electric-field-applying module 1500 descends, first probe pins PP1 may contact the first alignment pads AP1 and the second alignment pads AP2 of the mother substrate MSUB. In addition, when the second electric-field-applying module 1600 descends, second probe pins PP2 may contact third alignment pads AP3 and fourth alignment pads AP4 of the mother substrate MSUB.

Figure 26:
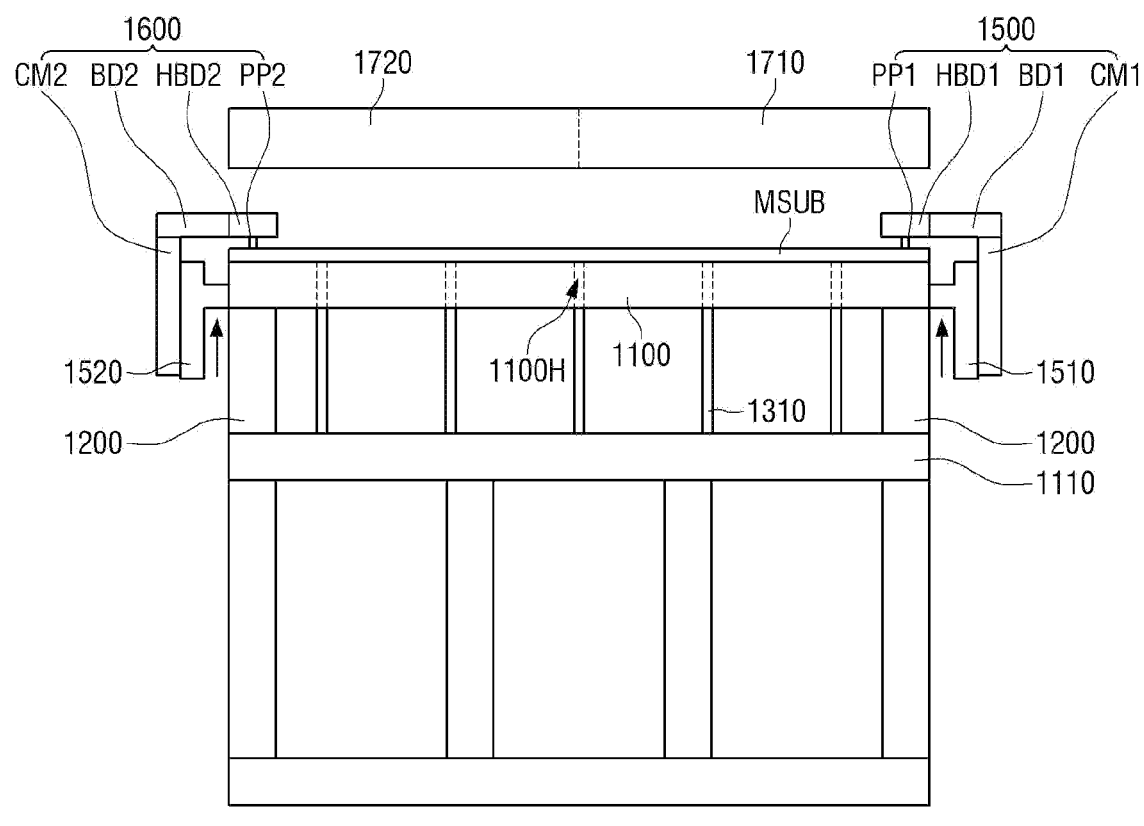

Next, referring to FIG. 26, the stage 1100 is raised so that the mother substrate MSUB is mounted on an upper surface of the stage 1100 (operation S230 of FIG. 23).

The control unit 1900 outputs a stage control signal SCS of a first logic level voltage to a stage moving unit 1200. The stage moving unit 1200 raises the stage 1100 by a preset height according to the stage control signal SCS of the first logic level voltage. The mother substrate MSUB may be mounted on the upper surface of the stage 1100.

Figure 27:
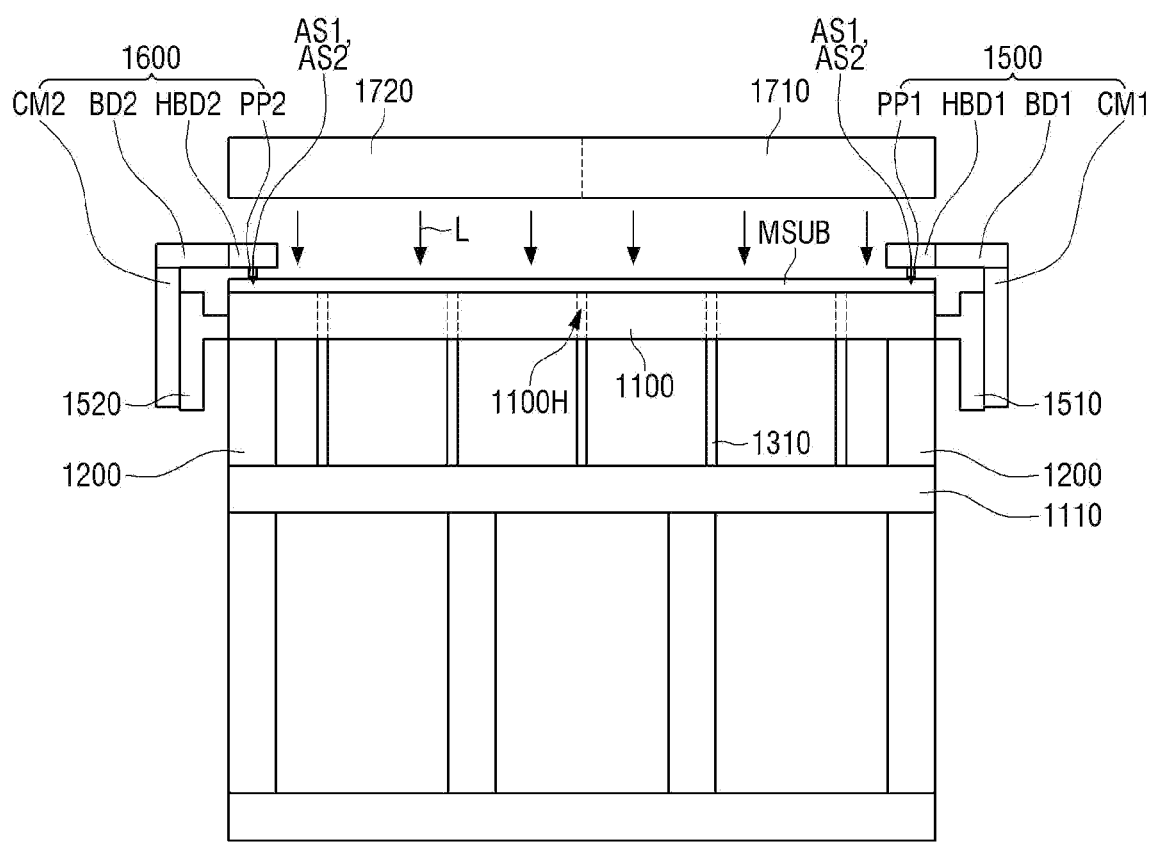

Next, referring to FIG. 27, a first alignment signal AS1 and the second alignment signal AS2 are transmitted to the first through fourth alignment pads AP1 through AP4 of the mother substrate MSUB through the first and second electric-field-applying modules 1500 and 1600. In addition, light is irradiated to the mother substrate MSUB by transmitting the first emission driving signal LDS1 to the first light-irradiating module 1710 and transmitting the second emission driving signal LDS2 to the second light-irradiating module 1720 (operation S240 of FIG. 23).

The control unit 1900 may output a first control signal CS1 of the first logic level voltage to a voltage output unit 1430, and the voltage output unit 1430 may generate the first alignment signal AS1, the second alignment signal AS2, a first emission timing signal LTS1, and a second emission timing signal LTS2. The first alignment signal AS1 may be a ground voltage or a DC signal having a level (e.g., a predetermined level). The second alignment signal AS2 may be an AC signal.

The voltage output unit 1430 may output the first alignment signal AS1 and the second alignment signal AS2 to a first amplifier 1410 and a second amplifier 1420. The first amplifier 1410 may output the amplified first alignment signal AS1 and/or the amplified second alignment signal AS2 to the first electric-field-applying module 1500. The second amplifier 1420 may output the amplified first alignment signal AS1 and/or the amplified second alignment signal AS2 to the second electric-field-applying module 1600. Through the first probe pins PP1 of the first electric-field-applying module 1500, the first alignment signal AS1 may be transmitted to the first alignment pads AP1 of the mother substrate MSUB, and the second alignment signal AS2 may be transmitted to the second alignment pads AP2 of the mother substrate MSUB. Through the second probe pins PP2 of the second electric-field-applying module 1600, the first alignment signal AS1 may be transmitted to the third alignment pads AP3 of the mother substrate MSUB, and the second alignment signal AS2 may be transmitted to the fourth alignment pads AP4 of the mother substrate MSUB.

The first alignment signal AS1 may be transmitted to the first alignment line AL1 of each of display panel cells CEL1 and CEL2, and the second alignment signal AS2 may be transmitted to the second alignment line AL2. Therefore, the light emitting elements 172 of all the subpixels PX1 through PX3 of a display panel 100 may be aligned by an electric field formed by the first alignment signal AS1 of the first alignment line AL1 and the second alignment signal AS2 of the second alignment line AL2.

The first light emission driver 1731 may generate the first emission driving signal LDS1 applied as a constant current. The first light emission driver 1731 may transmit the first emission driving signal LDS1 to light emitting diode arrays LS1 through LSq of the first light-irradiating module 1710 according to the first emission timing signal LTS1. Therefore, the light emitting diode arrays LS1 through LSq of the first light-irradiating module 1710 may emit light with a duty ratio (e.g., a predetermined duty ratio).

The second light emission driver 1732 may generate the second emission driving signal LDS2 applied as a constant current. The second light emission driver 1732 may transmit the second emission driving signal LDS2 with a duty ratio (e.g., a predetermined duty ratio) to light emitting diode arrays LS1 through LSq of the second light-irradiating module 1720 according to the second emission timing signal LTS2. Therefore, the light emitting diode arrays LS1 through LSq of the second light-irradiating module 1720 may emit light with the duty ratio (e.g., a predetermined duty ratio).

Here, when a distance between the light-irradiating module 1700 and the mother substrate MSUB is less than about 10 mm or greater than about 50 mm, the uniformity of light applied to the mother substrate MSUB may decrease. Therefore, the distance between the light-irradiating module 1700 and the mother substrate MSUB may be about 10 mm to about 50 mm, for example, about 30 mm.

Figure 28:
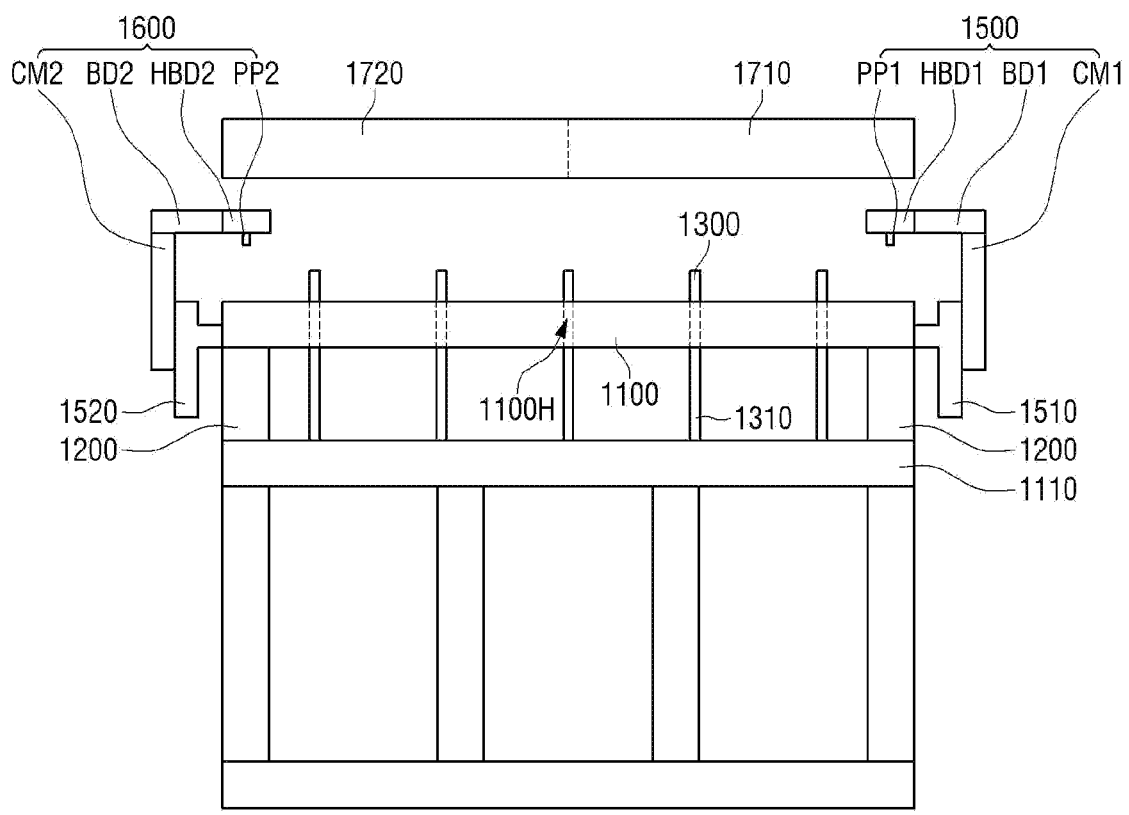

Next, referring to FIG. 28, the first and second electric-field-applying modules 1500 and 1600 are raised, and the stage 1100 is lowered. Then, the mother substrate MSUB is discharged (operation S250 of FIG. 23).

The control unit 1900 may output the first control signal CS1 of the second logic level voltage to the voltage output unit 1430, and the voltage output unit 1430 may no longer generate the first alignment signal AS1, the second alignment signal AS2, the first emission timing signal LTS1, and the second emission timing signal LTS2. Therefore, the first alignment signal AS1 and the second alignment signal AS2 might not be transmitted to the first probe pins PP1 of the first electric-field-applying module 1500. In addition, the first emission timing signal LTS1 might not be transmitted to the first light emission driver 1731, and the second emission timing signal LTS2 might not be transmitted to the second light emission driver 1732.

The control unit 1900 outputs the first module movement signal MVS1 of the first logic level voltage to the first module moving unit 1510, and outputs the second module movement signal MVS2 of the first logic level voltage to the second module moving unit 1520. The first module moving unit 1510 raises the first electric-field-applying module 1500 (e.g., by a preset height) according to the first module movement signal MVS1 of the first logic level voltage, and the second module moving unit 1520 raises the second electric-field-applying module 1600 (e.g., by a preset height) according to the second module movement signal MVS2 of the first logic level voltage.

Next, the control unit 1900 outputs the stage control signal SCS of the second logic level voltage to the stage moving unit 1200. The stage moving unit 1200 lowers the stage 1100 (e.g., by a preset height) according to the stage control signal SCS of the second logic level voltage. Therefore, the support pins 1300 may protrude from the upper surface of the stage 1100, and the mother substrate MSUB may be supported by the support pins 1300.

Next, the mother substrate MSUB may be discharged from the manufacturing apparatus 1000 using a robot or the like.

Referring to FIGS. 23 through 28, the first light-irradiating module 1710 and the second light-irradiating module 1720 may irradiate light to the mother substrate MSUB at a time when an electric field is applied to align the light emitting elements 172. Accordingly, a permanent dipole moment may be strongly generated in each of the light emitting elements 172 at the time when the electric field is applied to align the light emitting elements 172. Therefore, because a dielectrophoretic force is applied to the light emitting elements 172 by the electric field, the light emitting elements 172 may be aligned such that second semiconductor layers 172b are located toward the first alignment line AL1. That is, the light emitting elements 172 may be deflected. Thus, the alignment accuracy of the light emitting elements 172 can be increased.

However, the aspects of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. An apparatus for manufacturing a display device, comprising:
a stage;
a first electric-field-applying module on a first side of the stage, and comprising first probe pins;
a first light-irradiating module above the stage, and configured to irradiate light to the stage;
a first light emission driver configured to transmit a first emission driving signal to the first light-irradiating module; and
a signal output unit configured to output a first emission timing signal for setting light irradiation timing of the first light-irradiating module to the first light emission driver, to output a first alignment signal to any one of the first probe pins, and to output a second alignment signal to another one of the first probe pins,
wherein the first emission timing signal and the second alignment signal are alternating current (AC) signals, and
wherein a period of the first emission timing signal is the same as a period of the second alignment signal.

2. The apparatus of claim 1, wherein the first alignment signal is a direct current (DC) signal.

3. The apparatus of claim 1, wherein the first emission timing signal has a second high level voltage at a time when the second alignment signal changes from a first low level voltage to a first high level voltage.

4. The apparatus of claim 3, wherein a period during which the second alignment signal rises from the first low level voltage to the first high level voltage is shorter than a period during which the second alignment signal falls from the first high level voltage to the first low level voltage.

5. The apparatus of claim 3, wherein the period during which the second alignment signal rises from the first low level voltage to the first high level voltage is longer than the period during which the second alignment signal falls from the first high level voltage to the first low level voltage.

6. The apparatus of claim 3, wherein the second alignment signal has the first high level voltage during a first period and the first low level voltage during a second period.

7. The apparatus of claim 6, wherein at least a portion of a period during which the second alignment signal has the first high level voltage and at least a portion of a period during which the first emission timing signal has the second high level voltage overlap each other.

8. The apparatus of claim 6, wherein the period during which the second alignment signal has the first high level voltage is longer than the period during which the first emission timing signal has the second high level voltage.

9. The apparatus of claim 3, wherein the first emission timing signal has the second high level voltage during a first period and a second low level voltage during a second period.

10. The apparatus of claim 1, further comprising a second light-irradiating module on the stage, configured to irradiate light to the stage, and neighbors the first light-irradiating module.

11. The apparatus of claim 10, further comprising a second light emission driver configured to transmit a second emission driving signal to the second light-irradiating module according to a second emission timing signal for setting light irradiation timing of the second light-irradiating module.

12. The apparatus of claim 1, wherein the first light emission driver comprises:
a constant current control circuit configured to provide a constant current to light emitting diodes of the first light-irradiating module; and
a transistor between the light emitting diodes and a ground voltage source, and configured to be turned on according to the first emission timing signal.

13. The apparatus of claim 1, further comprising:
a second electric-field-applying module on a second side of the stage, and comprising second probe pins;
a first amplifier configured to amplify the first alignment signal and the second alignment signal, and to output the amplified first alignment signal and the amplified second alignment signal to the first probe pins of the first electric-field-applying module; and
a second amplifier configured to amplify the first alignment signal and the second alignment signal, and to output the amplified first alignment signal and the amplified second alignment signal to the second probe pins of the second electric-field-applying module.

14. A method of manufacturing a display device, comprising:
forming a first alignment line and a second alignment line on a mother substrate;
forming an outer bank on the first alignment line and the second alignment line;
applying a solution comprising light emitting elements to a first opening defined by the outer bank;
aligning the light emitting elements by forming an electric field by applying a first alignment voltage to the first alignment line and applying a second alignment voltage to the second alignment line; and
removing the solution by volatilizing the solution,
wherein the aligning of the light emitting elements by forming the electric field comprises:
generating a first alignment signal, and a second alignment signal and a first emission timing signal;
transmitting the first alignment signal and the second alignment signal to a first alignment pad electrically connected to the first alignment line and a second alignment pad electrically connected to the second alignment line through first probe pins of a first electric-field-applying module; and
irradiating light to the mother substrate by transmitting a first emission driving signal to light emitting diode arrays of a first light-irradiating module according to the first emission timing signal, and
wherein a period of the first emission timing signal is same as a period of the second alignment signal.

15. The method of claim 14, wherein the first alignment signal is a DC signal, and
wherein the first emission timing signal is an AC signal.

16. The method of claim 14, wherein the first emission timing signal has a second high level voltage at a time when the second alignment signal changes from a first low level voltage to a first high level voltage.

17. The method of claim 16, wherein the first emission timing signal has the second high level voltage during a first period, and a second low level voltage during a second period.

18. The method of claim 14, wherein the transmitting of the first alignment signal and the second alignment signal to the first alignment pad electrically connected to the first alignment line and the second alignment pad electrically connected to the second alignment line through the first probe pins of the first electric-field-applying module comprises:
amplifying the first alignment signal and the second alignment signal; and
transmitting the amplified first alignment signal and the amplified second alignment signal to the first alignment pad and the second alignment pad through the first probe pins of the first electric-field-applying module.

19. The method of claim 14, wherein the generating of the second alignment signal and the first emission timing signal comprises generating a second emission timing signal having the same period as the second alignment signal, and
wherein the aligning of the light emitting elements by forming the electric field further comprises irradiating light to the mother substrate by transmitting a second emission driving signal to light emitting diode arrays of a second light-irradiating module according to the second emission timing signal.

20. The method of claim 14, further comprising:
forming a first electrode and a second electrode of each subpixel by cutting the first alignment line and the second alignment line;
forming a first contact electrode that connects the first electrode and an end of each of the light emitting elements in each subpixel; and
forming a second contact electrode that connects the second electrode and the other end of each of the light emitting elements in each subpixel.

* * * * *